(12) United States Patent
Prodanov et al.

(10) Patent No.: US 7,509,516 B2
(45) Date of Patent: Mar. 24, 2009

(54) AC TECHNIQUE FOR ELIMINATING PHASE AMBIGUITY IN CLOCKING SIGNALS

(75) Inventors: Vladimir Prodanov, New Providence, NJ (US); Mihai Banu, New Providence, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 230 days.

(21) Appl. No.: 11/397,005

(22) Filed: Apr. 3, 2006

(65) Prior Publication Data
US 2007/0127613 A1 Jun. 7, 2007

Related U.S. Application Data

(60) Provisional application No. 60/742,803, filed on Dec. 6, 2005, provisional application No. 60/751,180, filed on Dec. 16, 2005.

(51) Int. Cl.
*G06F 1/00* (2006.01)
(52) U.S. Cl. ....................................................... 713/500
(58) Field of Classification Search .................. 713/500
See application file for complete search history.

(56) References Cited

U.S. PATENT DOCUMENTS

| | | | |
|---|---|---|---|
| 5,394,490 A | 2/1995 | Kato et al. | |
| 6,002,282 A | 12/1999 | Alfke | |
| 6,282,210 B1 | 8/2001 | Rapport et al. | |
| 6,647,506 B1 | 11/2003 | Yang et al. | |
| 6,754,841 B2 | 6/2004 | Yang | |
| 6,943,610 B2 | 9/2005 | Saint-Laurent | |
| 7,043,657 B1 | 5/2006 | Yang et al. | |
| 7,263,149 B2 * | 8/2007 | Ware et al. | .......... 375/354 |
| 2001/0033630 A1 | 10/2001 | Hassoun et al. | |
| 2002/0153936 A1 | 10/2002 | Zerbe | |
| 2005/0047445 A1 | 3/2005 | Stepanov et al. | |
| 2005/0047538 A1 | 3/2005 | Jaussi et al. | |

(Continued)

OTHER PUBLICATIONS

Yang, C., "A One-Wire Approach for Skew-Compensating Clock Distribution Based on Bidirectional Techniques", IEEE Journal of Solid-State Circuits, vol. 36, No. 2, Feb. 2001.

(Continued)

*Primary Examiner*—Thomas Lee
*Assistant Examiner*—Mohammed H Rehman
(74) *Attorney, Agent, or Firm*—Eric L. Prahl

(57) ABSTRACT

A method involving: distributing two clock signals over a clock signal distribution system; in each of a plurality local clocking regions located along the signal distribution system, detecting the two clock signals and generating therefrom a local clock signal for that local clocking region, wherein the generated local clock signals for at least some of the plurality of local clocking regions are in a first group all of which are aligned in phase with each other and the generated local clock signals for the remainder of the plurality of local clocking regions are in a second group all of which are aligned in phase with each other, and wherein the phase of the first group is out of phase with the phase of the second group by a predetermined amount; and bringing all of the clock signals for the plurality of local clocking regions into phase alignment so that the phase of the first group is in phase with the phase of the second group.

22 Claims, 18 Drawing Sheets

U.S. PATENT DOCUMENTS

| | | | |
|---|---|---|---|
| 2006/0002499 A1* | 1/2006 | Guenoun et al. | 375/371 |
| 2006/0107154 A1* | 5/2006 | Bansal et al. | 714/738 |
| 2006/0267988 A1* | 11/2006 | Hussain et al. | 345/502 |
| 2008/0054957 A1 | 3/2008 | Takeda et al. | |

OTHER PUBLICATIONS

O'Mahony, F., et al., "10GHz Clock Distribution Using Coupled Standing-Wave Oscillators" Stanford University, Stanford, CA.

O'Mahoney, F. et al., 10GHz clock distribution using coupled standing-wave oscillators, Stanford University, Stanford, CA.

Taskin et al., "A One-Wire Approach for Skew-Compensating Clock Distribution Based on Bidirectional Techneques", IEEE Journalof Solid STate Circuits [online] Feb. 2001 [retrieved on Oct. 10, 2007], Retrieved from the Internet <URL: http://ieeexplore.ieee.org/xpl/freeabs_all.jsp?tp=&arnumber=902767&isnumber=19525>.

Patent Cooperation Treaty, International Search Report, dated Feb. 6, 2008, 2 pages.

Patent Cooperation Treaty, International Search Report, dated Feb. 14, 2008, 2 pages.

Patent Cooperation Treaty, International Search Report, dated Feb. 15, 2008, 2 pages.

Prodanov, V., et al. GHz Serial Passive Clock Distribution in VLSI Using Bidirectional Signaling, (online), Sep. 2006.

International Search Report issued for PCT/US2006/046536, dated Mar. 21, 2008.

* cited by examiner

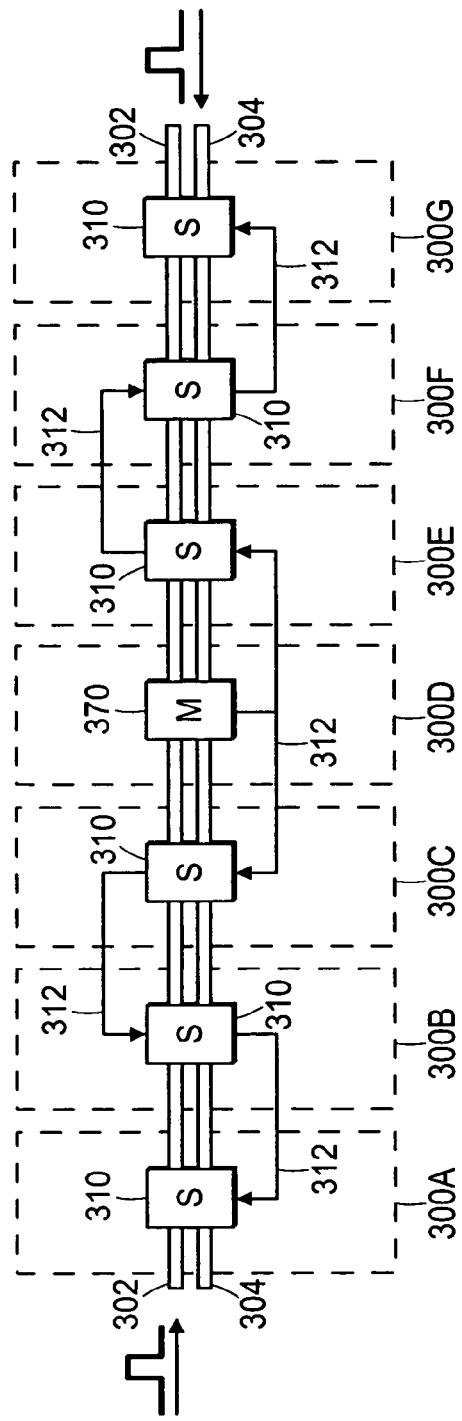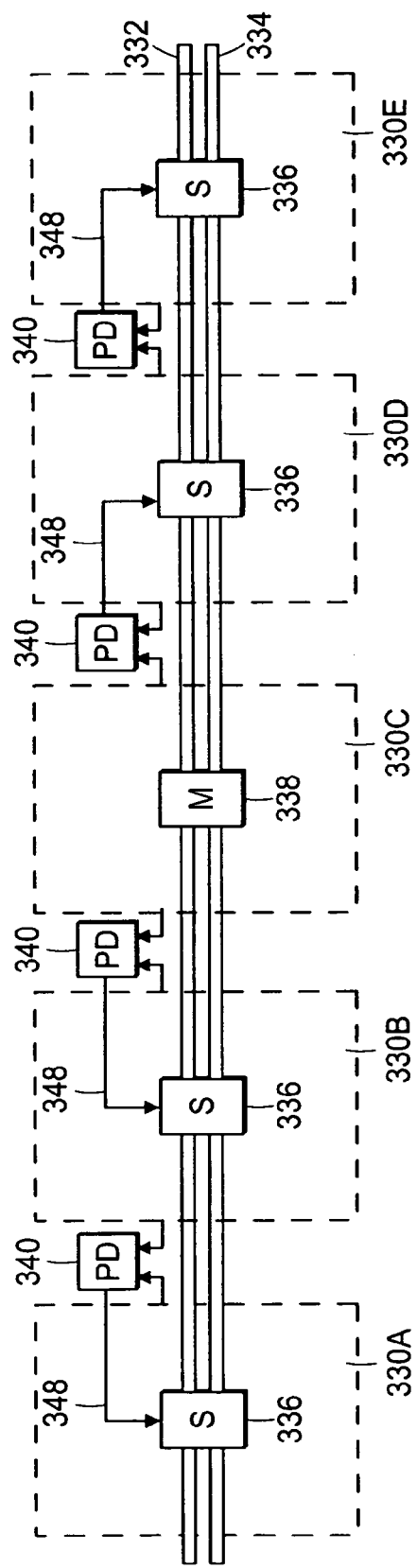
FIG. 17
FIG. 18

AC TECHNIQUE FOR ELIMINATING PHASE AMBIGUITY IN CLOCKING SIGNALS

This application claims the benefit of U.S. Provisional Application No. 60/742,803, filed Dec. 6, 2005 and U.S. Provisional Application No. 60/751,180, filed Dec. 16, 2005, both of which are incorporated herein by reference.

TECHNICAL FIELD

This invention relates to eliminating skew in optical and electrical signal distribution networks.

BACKGROUND OF THE INVENTION

Any conventional distribution network introduces skew (delay) due to finite signal propagation speed. For example, high frequency clock distribution in VLSI chips suffers from large delays produced mainly by charging/discharging parasitic line capacitances. These delays can be a substantial fraction of the clock period or even exceed it in severe cases. Even in the case of propagation at light speed, i.e. via on chip electrical transmission lines or silicon optical waveguides, the skew can easily accumulate to unacceptable levels for typical VLSI distances: approximately 12 ps for each mm. Likewise, in the case of transmission systems over multiple chips, PCBs, or subsystems, the skews can be extremely large.

The following considerations will focus on VLSI clock distribution, but similar arguments are valid for other cases of signal synchronization. In order to clock VLSI digital blocks that are spaced far apart with respect to each other, the relative skews must be first corrected, usually using Delay-Locked-Loop (DLL) of Phase-Locked-Loop (PLL) techniques. However, these brute force methods are becoming increasingly costly and power hungry with each new IC technology node, as the number of local clocking regions and the clock speed are increasing. Developing simpler and more efficient methods for skew elimination is highly desirable.

SUMMARY OF THE INVENTION

In general, in one aspect, the invention features a method involving: introducing a first clock signal into a first end of a signal distribution system so that the first clock signal propagates from the first end to the second end of the signal distribution system; introducing a second clock signal into the second end of the signal distribution system so that the second clock signal propagates from the second end to the first end of the signal distribution system; in each of a plurality local clocking regions located along the signal distribution system, detecting the first and second clock signals and generating therefrom a local clock signal for that local clocking region, wherein the generated local clock signals for at least some of the plurality of local clocking regions are in a first group all of which are aligned in phase with each other and the generated local clock signals for the remainder of the plurality of local clocking regions are in a second group all of which are aligned in phase with each other, and wherein the phase of the first group is out of phase with the phase of the second group by a predetermined amount; and bringing all of the clock signals for the plurality of local clocking regions into phase alignment so that the phase of the first group is in phase with the phase of the second group.

Other embodiments of the invention include one or more of the following features. One of the local clocking regions is a master clocking region and the rest of the plurality of clocking regions are slave clocking regions, and wherein bringing all of the clock signals for the plurality of regions into phase alignment involves bringing all of the clock signals for all of the slave clocking regions among the plurality of clocking region into phase alignment with the clock signal of the master clocking region. Bringing all of the clock signals for the plurality of regions into phase alignment involves, in each slave clocking region among the plurality of clocking regions, obtaining clocking information from another local clocking region among the plurality of clocking regions and depending on that clocking information obtained from the another local clocking region either changing the phase of the clock signal for that local clocking region by the predetermined amount or leaving the phase of the clock signal for that local clocking region unchanged. The phase of the first group is out of phase with the phase of the second group by 180°. Bringing all of the clock signals for the plurality of local clocking regions into phase alignment so that the phase of the first group is in phase with the phase of the second group involves inverting the clocking signals of the second group. Bringing all of the clock signals for the plurality of regions into phase alignment involves, in each slave clocking region among the plurality of clocking regions, receiving the local clock signal from a neighboring local clocking region that is among the plurality of clocking regions and in at least some of the local clocking regions, using that received local clock signal to align the local clock signal for that local clocking region with the local clock signal of the neighboring local clocking region. Using that received local clock signal to align the local clock signal for that local clocking region with the local clock signal of the neighboring local clocking region involves one of either shifting its phase by 180° or leaving its phase unchanged. The first and second clock signals are optical signals, and the signal distribution system is an optical waveguide.

Other embodiments of the invention include one or more of the following features. The local clock signal in each of the plurality of local clocking regions is an electrical signal. The signal distribution system includes a first optical waveguide and a second optical waveguide, and introducing the first clock signal into the first end of the signal distribution system involves introducing the first clock signal into one end of the first optical waveguide, and introducing the second clock signal into the second end of the signal distribution system involves introducing the second clock signal into one end of the second optical waveguide. The local clock signal in each of the plurality of local clocking regions is an electrical signal.

In general, in another aspect, the invention features a method involving: distributing two clock signals over a clock signal distribution system; in each of a plurality local clocking regions located along the signal distribution system, detecting the two clock signals and generating therefrom a local clock signal for that local clocking region, wherein the generated local clock signals for at least some of the plurality of local clocking regions are in a first group all of which are aligned in phase with each other and the generated local clock signals for the remainder of the plurality of local clocking regions are in a second group all of which are aligned in phase with each other, and wherein the phase of the first group is out of phase with the phase of the second group by a predetermined amount; and bringing all of the clock signals for the plurality of local clocking regions into phase alignment so that the phase of the first group is in phase with the phase of the second group.

In general, in still another aspect, the invention features an integrated circuit including: a clock signal distribution network having a first end and a second end, the clock signal distribution network for carrying a first global clock signal that travels from the first end to the second end and a second global clock signal that travels from the second end to the first end; and a plurality of local clocking regions arranged along the clock signal distribution network, each of which includes a local clock signal generation circuit and an associated detector arrangement that connects that clock signal generation circuit to the clock signal distribution network at a predetermined location within that local clocking region, wherein the local clock generation circuit in each local clocking region generates during operation a local clock signal based upon the first and second clock global signals that are detected by the detector arrangement at the predetermined location within that local clocking region, wherein the plurality of local clocking regions includes a master local clocking region, wherein, among the plurality of local clocking regions, each local clocking region other than the master local clocking region also includes a synchronization signal line connecting the local clock signal generated by the local clock generation circuit in a neighboring local clocking region to the local clock signal generation circuit in that local clocking region, and wherein the local clock signal generation circuit in each local clocking region other than the master local clocking region also includes phase alignment circuitry that during operation responds to a signal delivered over the synchronization signal line indicating by aligning the local clock signal for that local clocking region with the local clock signal of the neighboring local clocking region when that delivered signal indicates a nonalignment condition exists.

Other embodiments include one or more of the following features. The clock signal distribution network is a single signal transmission line. Alternatively, the clock signal distribution network includes first and second signal transmission lines, both of which extend from the first end of the clock signal distribution network to the second end of the signal distribution network, wherein the first signal transmission line is for carrying the first global clock signal and the second signal transmission line is for carrying the second global clock signal. In each of the local clocking regions, the detector arrangement therein includes a first detector connected to the first signal transmission line and a second detector connected to the second signal transmission line. The first signal transmission line is a first optical waveguide and the second signal transmission line is a second optical waveguide. The local clock signal in each local clocking region is an electrical signal. The phase alignment circuitry in each local clocking region includes an inverter.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

FIG. 17 is a block diagram of a circuit for eliminating phase ambiguity.

FIG. 18 is a block diagram of another circuit for eliminating phase ambiguity.

DETAILED DESCRIPTION

The Method of Bidirectional Signaling

The techniques discussed in greater detail below use bidirectional signaling as a way to deal with skew in distributed clock signals. In one of its most straightforward implementations, the method of bidirectional signaling uses two identical transmission networks running side by side, excited from opposite ends with the same clock signal. At each coordinate along the two networks, an observer detects two delayed versions of the transmitted signal traveling in opposite directions. The average skew of the two delayed signals is, however, independent of the position where the signals are detected, i.e., it is a constant value regardless of location. The constant average skew is the time taken by the two signal versions propagating in opposite directions to arrive at the point where they meet. In the case of uniform networks, this point is in the middle of the networks. As a consequence of this property of the average skew, any number of signals along the transmission network regenerated with the average skew will be automatically synchronized. This property also applies to non-uniform transmission networks.

Figure 1:
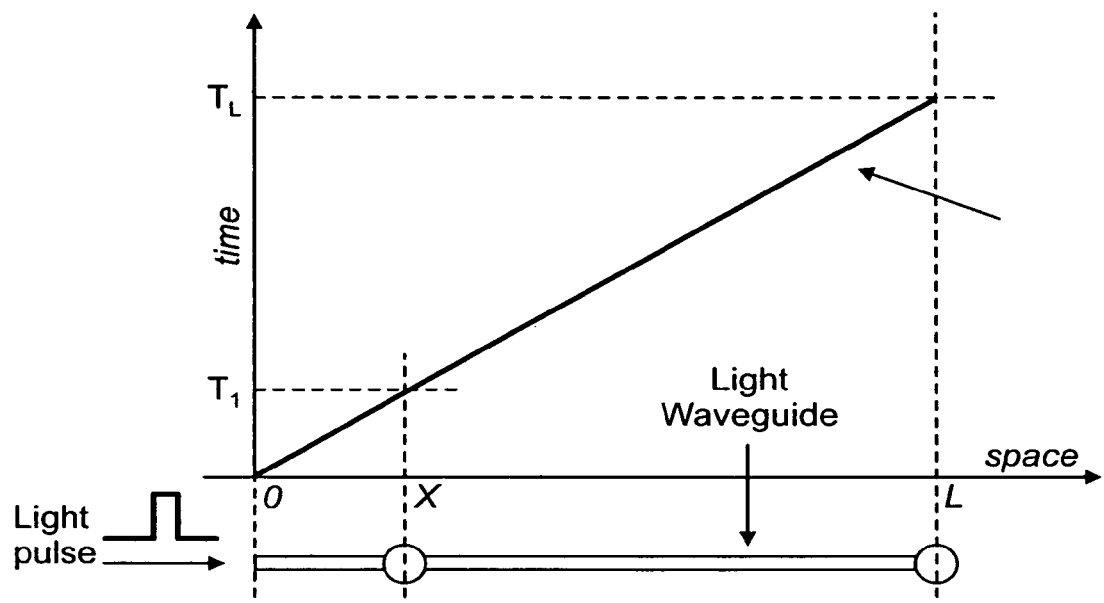
FIG. 1 is a graph showing the progress of an optical pulse along an optical waveguide.

The principle is more fully described in connection with FIGS. 1-3. FIG. 1 shows a single optical waveguide of length L. A light pulse that is introduced into the left end of the waveguide will propagate down the waveguide. For this example, it is assumed that the waveguide has uniform properties and so the pulse will travel along the waveguide with a constant velocity. Note that at time, $T_1$, the pulse will have traveled distance X and at time, $T_L$, it will have traveled a distance L, the full length of the waveguide. These times represent the skew of the optical clock signal. Obviously, the skew increases the further that the optical pulse must travel along the optical waveguide. De-skewing the signals detected at X and L relative to each other would require a delay element precisely matched to (L−X).

Figure 2:
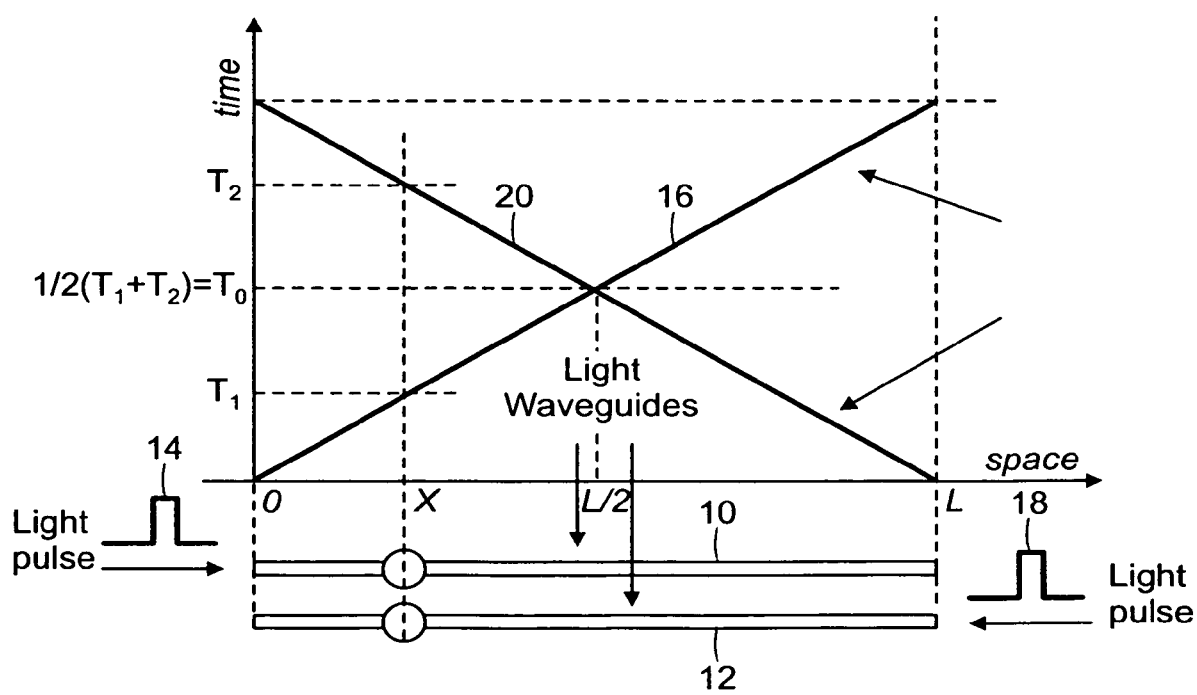
FIG. 2 is a graph showing the progress along an optical waveguide of two optical pulses, one introduced into a first waveguide at the near end and the other introduced into a second waveguide at the far end.

Now assume that there are two optical waveguides 10 and 12 constructed parallel to each other, both having the same properties and length L, as illustrated in FIG. 2. As before, a light pulse 14 introduced into the left side of optical waveguide 10 will propagate down the waveguide. Its progress down the waveguide is represented by line 16, which shows position along the horizontal axis as a function of time along the vertical axis. If an identical light pulse 18 is introduced into the opposite end of optical waveguide 12, it will propagate in the opposite direction. Its progress is represented by line 20. If it is assumed that optical waveguides 10 and 12 are identical and have uniform properties, pulse 14 and pulse 18 will arrive at the midpoints of their respective waveguides, i.e., location L/2, at precisely the same time, namely, $T_0$. Thus, both optical signals will have a skew of $T_0$ relative to their origins. If a detector is located in each waveguide at position X, which is closer to the beginning of optical waveguide 10 than to its end, then the two detectors will see the optical pulses in their respective waveguides arriving at different times. One detector will see pulse 14 arrive at time, $T_1$, and the other detector, which is also at the same location in the other waveguide, will see pulse 18 arrive at a later time, $T_2$. It will be the case, however, that the average skew for these two optical pulses will be equal to $T_0$, i.e., $\frac{1}{2}(T_1+T_2)=T_0$. Moreover, this holds true for any location along the length of the waveguides. That is, the average skew is independent of the location X at which the two detectors are positioned. In addition, the average skew is proportional to the length, L, of the optical waveguides. Thus, by referencing $T_0$, it becomes possible to achieve zero-skew clock distribution along the waveguide.

This, of course, takes advantage of the fact that the clock signal is a periodic signal in which case the objective is to get the phases of all generated local clock signals (i.e., the clocks generated at various points along the optical waveguide for local circuitry) to be aligned with each other. In this case, we assume that a pulse is introduced into the waveguide every $2T_0$ seconds. Thus, the times that are shown in FIG. 2 are referenced to the start of each new pulse. In practice, the clock with the average skew is generated at $T_0$ seconds after each successive pulse is introduced into waveguide. The resulting local clock signals will occur at $T_0$, $3T_0$, $5T_0$, $7T_0$, etc.

Figure 3:
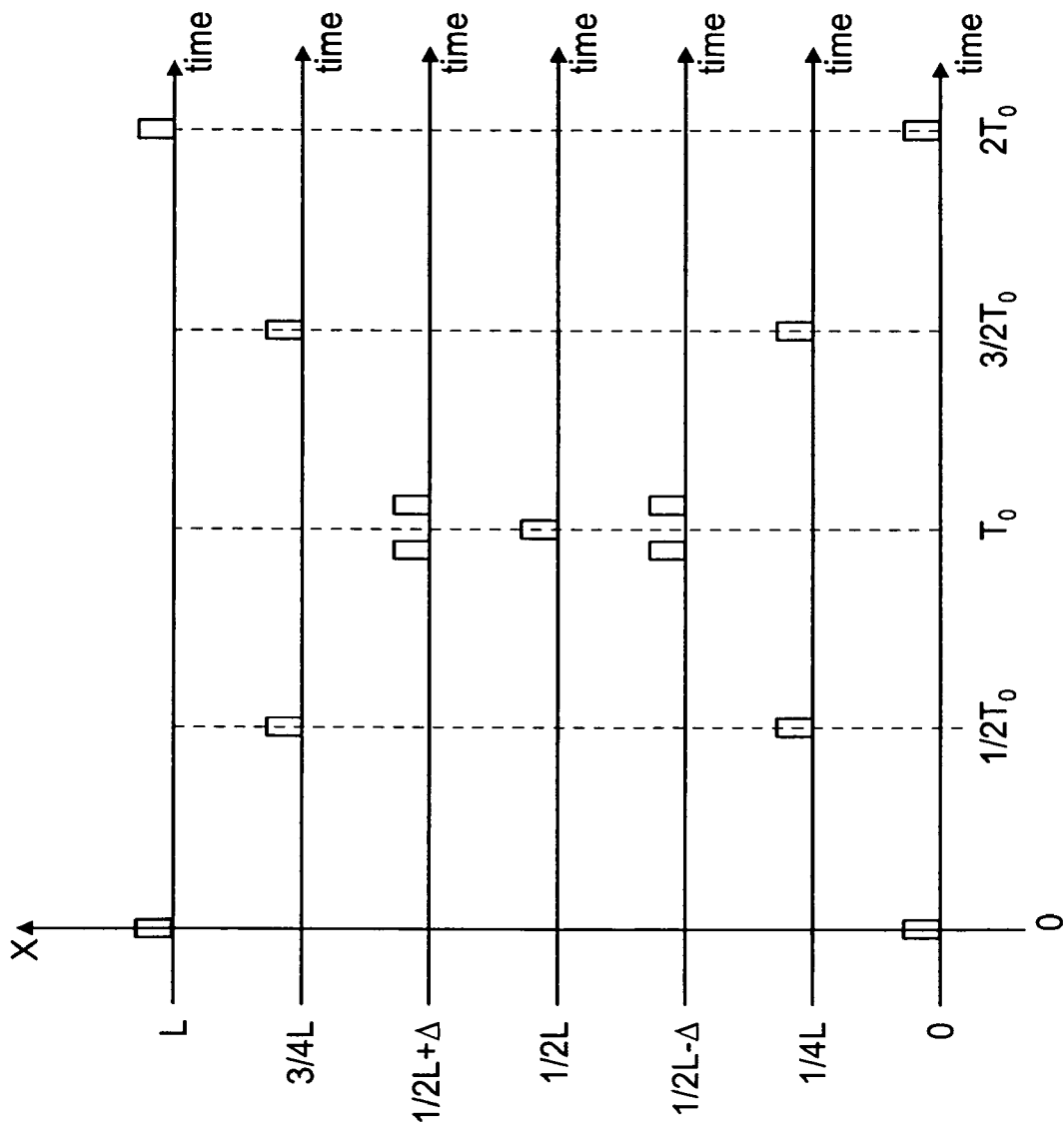
FIG. 3 shows the pulse train pattern of optical pulses that are detected at different locations along a pair of optical waveguides.

FIG. 3 further illustrates what has just been described by showing the detection times of the two light pulses as a function of location along the waveguides. At position x=0, one optical detector will see the first pulse immediately and the other optical detector in the other waveguide will see the second pulse at a time $2T_0$ later. At position x=L/4, the detector in one waveguide will see the first pulse at time $T_0/2$ and the detector in the other waveguide will see the second pulse at $3T_0/2$. A short distance before the middle of the waveguide, e.g. at $x=\frac{1}{2}L-\Delta$, the two pulses will be right next to each other in time. Then a short distance later, namely, at the midpoint x=L/2, the two pulses be detected at the same time, namely $T_0$. As one moves further down the length of the optical waveguides the same relationships exist between the detection of the two pulses except the order in which they are detected is reversed.

If the transmission networks are optical networks, the system is referred to as a Bidirectional Optical Signaling (BOS) system; and if the transmission networks are electrical networks, the system is referred to as a Bidirectional Electrical Signaling (BES) system. Both cases are generally referred we have Bidirectional Signaling Systems or BSS.

The method described above can be further generalized into a simple but powerful principle of signaling with a constant common-mode skew component.

Average Time Extraction Circuit

The described method of skew elimination using bidirectional signaling uses a circuit with two inputs and which can extract the average arrival time (average skew) of two signals that were applied on the two inputs. Typically, these signals are pairs of pulses, each pair consisting of an early pulse applied at one input and a late pulse applied at the other input. In the case of optical transmission, the early and late pulses are current signals, which are generated by optical detectors and which will typically be very short in duration.

Naturally, since the average arrival time between the early pulse and the late pulse is earlier than the arrival time of the late pulse, a system extracting this average time from a single pair of pulses would be non causal and therefore unrealizable. However, if trains of early and late pulses of the same period are transmitted, as is the case with clock signals, it is possible to design circuits to extract the average time between the early pulse train and the late pulse train. Such a circuit will be called an Average Time Extractor or ATE.

Average Time Extraction by Closed-Loop Pulse Width Control—First Variation

Figure 4A:
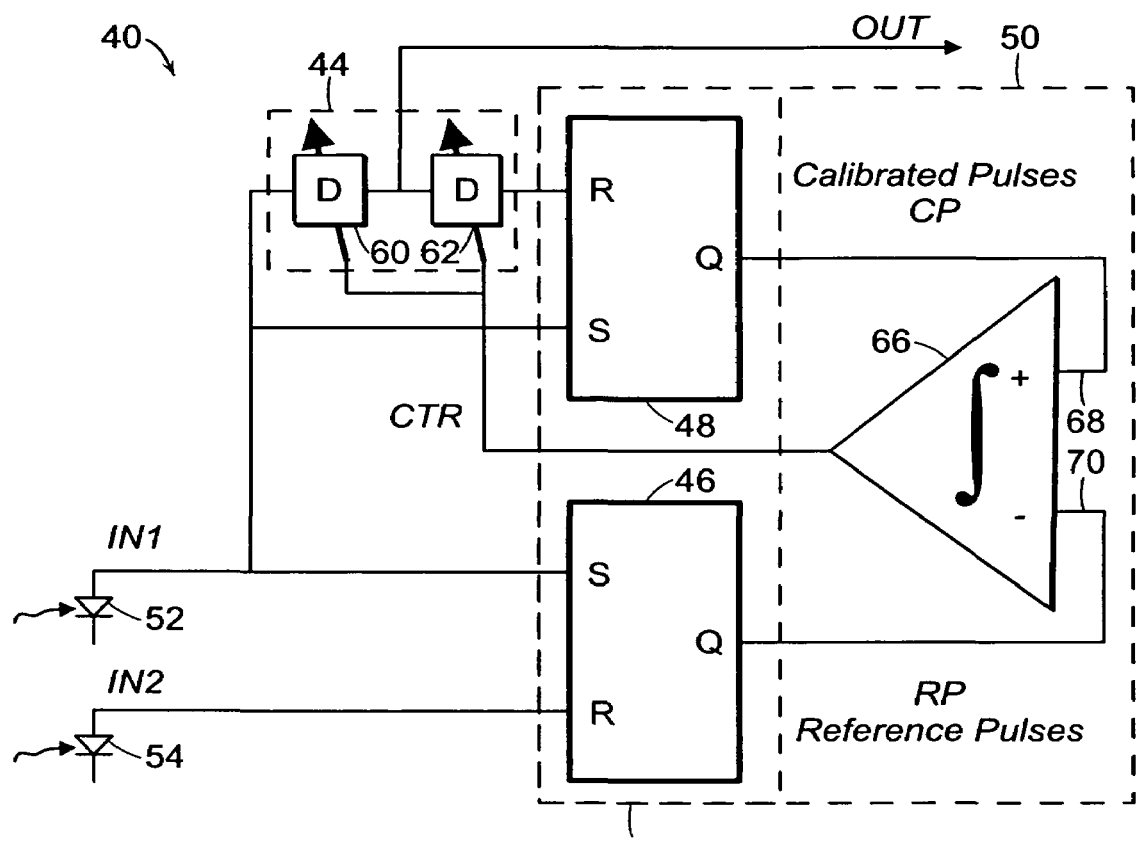
FIG. 4A is a block diagram of an average time extractor (ATE) circuit that uses two identical delay elements connected in series.
Figure 4B:
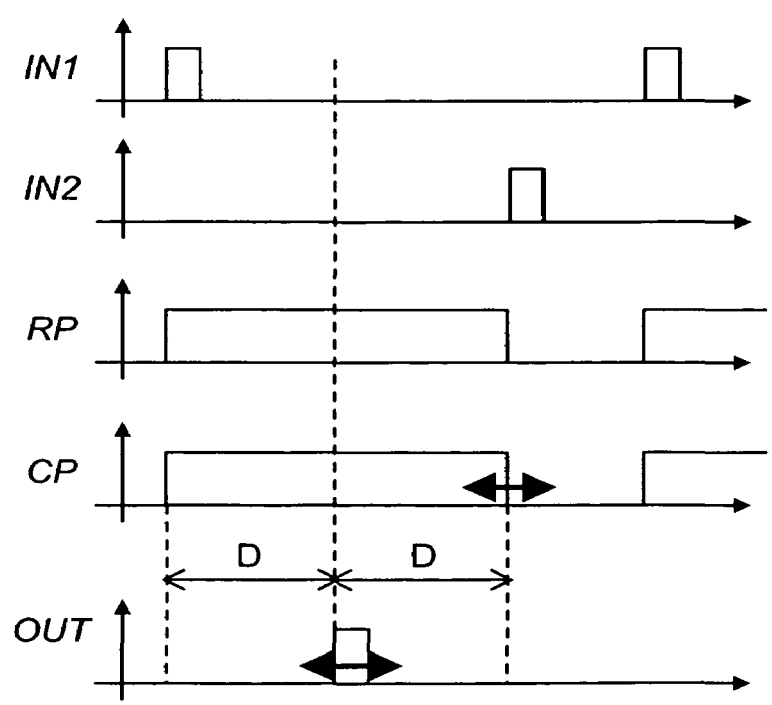
FIG. 4B shows the signals at various points in the ATE circuit of FIG. 4A.

Referring to FIG. 4, an embodiment of an ATE 40 contains: (a) module 40 to generate two internal pulse trains from the early and late input pulses; and (b) a module 44 which includes two identical variable delay elements connected in series. The first internal pulse train is called the reference pulse (RP) pulse train and the second internal pulse train is called the calibrated pulse (CP) pulse train. The RP pulses are generated such that their duty cycle is a measure of the skew between the early and late input pulse trains. ATE 40 also has a feedback control system 50, which automatically adjusts the total delay through the two delay elements until the CP pulses and the RP pulses have identical widths. When this condition is accomplished, the skew of the pulses at the output of the first variable delay element is the average time skew of the input early and late pulses. ATE circuit 40 automatically generates a clock pulse at the average time $T_0$. Thus, if such circuits are located at different positions along the waveguide they will all generate local clock signals having the same skew, namely, $T_0$.

The details of the structure and operation of this particular embodiment of the ATE are as follows. ATE 40 includes two optical detectors 52 and 54, each one for detecting the optical pulses in a corresponding different one of the two waveguides. It also includes two set-reset flip flops 46 and 48, each with a set line (S), a reset line (R), and an output (Q). The output signals of detectors 52 and 54, namely, IN1 and IN2, respectively, control the operation of S-R flip-flops 46 and 48. Detector signal IN1, indicating the arrival of the optical pulse in the first optical waveguide, drives the S input of both flip-flops 46 and 48; and detector signal IN2, indicating the arrival of the optical pulse in the second optical waveguide, drives the R input of flip-flop 46. Two identical variable delay elements 60 and 62, each introducing a variable delay of τ, are connected in series between the R and S inputs of flip-flop 48. Thus, the pulses of the IN1 signal that set flip-flop 48 will reset it after a delay of 2τ as it comes out of the other side of the two delay elements. The output signal for the circuit, namely, the skew corrected clock signal (OUT), is taken from the point at which the two delay elements 60 and 62 are connected to each other. This output signal is a copy of the IN1 pulse delayed by τ. During operation, flip-flop 46 outputs a train of reference pulses (RP) and flip-flop 48 outputs a train of calibrated pulses (CP). Both trains of pulses RP and CP have a period equal to the period of the clock signal sent over the optical waveguides. The duration of the pulses in the RP train of pulses is equal to the delay between the pulses of the IN1 signal and the subsequent pulses of the IN2 signal; whereas the duration of the pulses of the CP train of pulses is equal to the delay introduced by delay elements 60 and 62, namely, 2τ.

The delay elements may be implemented in any of a number of different well-known ways. For example, they could be implemented by CMOS inverters (or "current-starved inverters") in which a current is used to drive a capacitance.

Feedback control system 50 of ATE 40 is implemented by an integrator 66, which has a positive input line 68 that is driven by CP sequence from the output of flip-flop 48, a negative input line 70 that is driven by RP sequence from the output of flip-flop 46, and it has an output that controls the delay of the two variable delay elements 60 and 62. When there is a positive signal on both input lines 68 and 70, the output of integrator 66 remains constant; when there is a positive signal on input line 68 and a zero signal on input line 70, the output of integrator 66 increases linearly as a function of time; and when there is a positive signal on input 70 and a zero signal on input line 68, the output of integrator 66 decreases linearly as a function of time. A simple way to implement feedback control system 50 is by using a precision charge pump that adds and subtracts charge from a capacitor proportionally to the widths of the pulses on RP and CP, respectively. So, the delay introduced by the variable delay elements will be proportional to the output signal from integrator 66.

In essence, the circuit sets the delay 2τ so that it equals the amount of time that separates the pulses on the two optical waveguides. It works as follows. Assume that the outputs of both flop-flops 46 and 48 are zero and the output of integrator 66 is also zero (so the delay introduced by the variable delay elements is fixed at whatever value had been previously established). Upon receiving the first pulse of the IN1 signal, both flip-flops 46 and 48 change state, outputting high signals on their output lines. Since the inputs to integrator 66 at that point will continue to be equal, the output signal from integrator 66 remains fixed at whatever value existed previously (assume it is zero). Delay module will cause the pulse of the IN1 signal to arrive at the reset line of flip-flop 48 at a time that is 2τ later. If we assume that 2τ is less than the time between the two pulses on the two optical waveguides, the delayed IN1 pulse will cause flip-flop 48 to reset at a time 2τ after it was set and before the arrival of the next pulse of the IN2 signal. When output of flop-flop 48 is reset, the signal to the positive input line 68 of integrator 66 will drop to zero while the signal on negative input line 70 of integrator 66 will remain high.

Since the signal on the negative input line is still high, the output of integrator 66 will begin to decrease, thereby causing the magnitude of the delay 2τ to increase. Eventually, the next pulse of the IN2 pulse train will arrive and reset flip-flop 46, causing its output to also fall to zero. At that time, both inputs of integrator 66 will be zero thereby causing its output remain constant at whatever value was established before flip-flop 46 was reset.

As long as the later pulse of the IN2 pulse train arrives at a time that is greater than 2τ after the earlier pulse of the IN1 pulse train, the circuit will operate during each cycle to increase the value of 2τ until 2τ equals the delay between the two pulses of the IN1 and IN2 pulse trains. When 2τ reaches that value, both flip-flops 46 and 48 will be reset at precisely the same time and the output of integrator 66 will remain constant at whatever value is required to keep 2τ equal to the delay between the two pulse trains. At that point, delay module 44 outputs a version of the IN1 signal delayed by an amount equal to τ, which is exactly one half of the distance between the pulses of the IN1 and IN2 signals (i.e., the average of the times at which the two pulses are detected).

If we assume that 2τ is greater than the time separating the earlier pulse of the IN1 signal and the later pulse of the IN2 signal, the circuit works to decrease the value of 2τ until it again precisely equals the time separating the two pulse trains.

Figure 5:
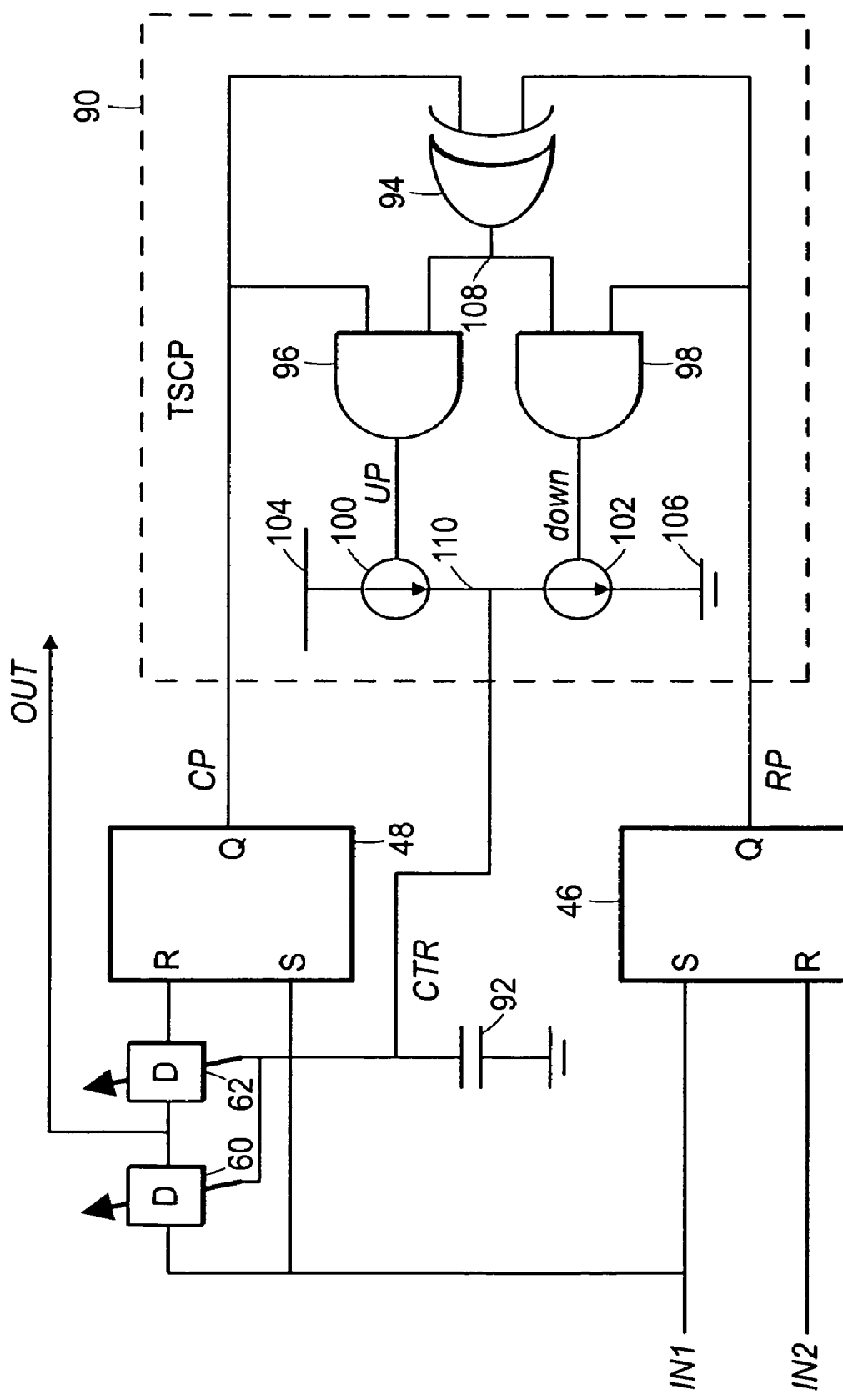
FIG. 5 shows an ATE circuit that employs a tri-state charge pump.

FIG. 5 shows an implementation of the above-mentioned integrator 66. It includes a tri-state charge pump (TSCP) 90 that charges/discharges a capacitor 92. Charge pump 90 is made up of: an XOR gate 94; two AND gates 96 and 98 connected in series between the output lines of flip-flops 46 and 48; and two current sources, namely UP current source 100 and DOWN current source 102, connected in series between a supply voltage line 104 and ground 106. Current sources 100 and 102 are connected together at another common node 110 to which capacitor 92 is also connected. The output line from flip-flop 48, which carries the CP pulse train, is connected to one input of XOR gate 94, the output line of flip-flop 46, which carries the RP pulse train, is connected to the other input of XOR gate 94, and the output of XOR gate 94 drives a common node 108. The output line of flip-flop 48 is also connected to one input of AND gate 96, the output line from flip-flop 46 is connected to one input of AND gate 98, and the other input of each AND gate 96 and 98 is connected together at common node 108. The output of AND gate 96 controls current source 100 and the output of AND gate 98 controls current source 102. The current supplied to capacitor 92 is equal to the sum of the currents supplied by the two current sources 100 and 102 to common node 110.

When the input signal to current source 100 is high, current source 100 sources a current $I_0$ into common node 110 and when the input signal to current source 100 is zero, it supplies no current to that node. Current source 102 operates in a similar manner, except that it functions to sink current out of common node 110.

The truth table for the arrangement of XOR gate 94 and two AND gates 102 and 104 is as follows:

| CP | RP | UP | DOWN |
|---|---|---|---|
| 0 | 0 | 0 | 0 |
| 0 | 1 | 0 | 1 |
| 1 | 0 | 1 | 0 |
| 1 | 1 | 0 | 0 |

Figure 6A:
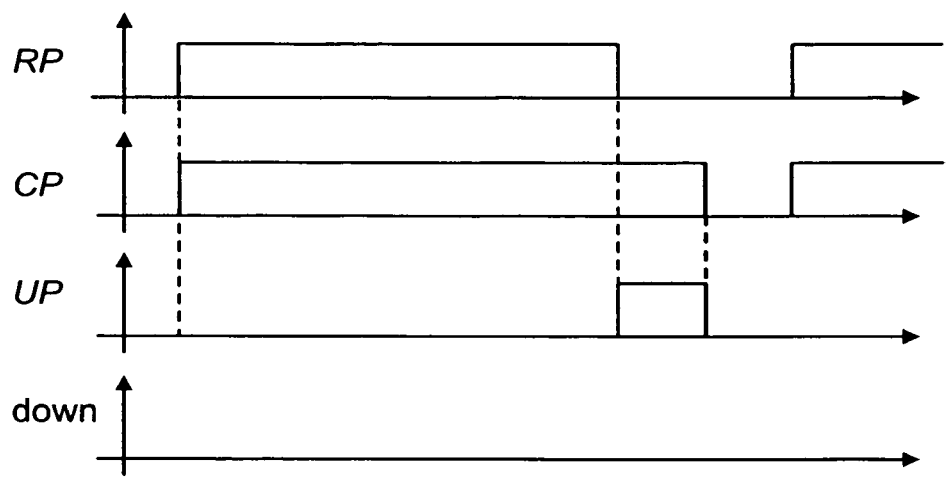
FIGS. 6A-C are signal diagrams illustrating the operation of the ATE circuit which includes the tri-state charge pump.
Figure 6B:
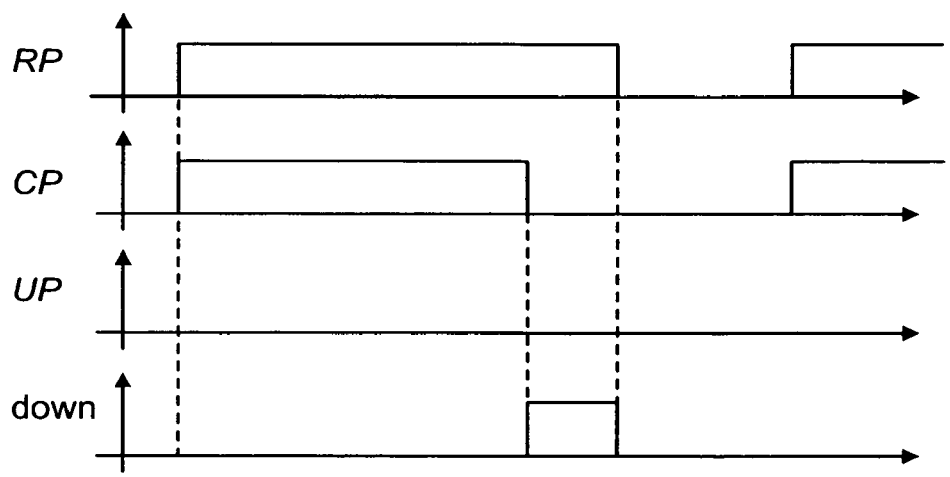
Figure 6C:
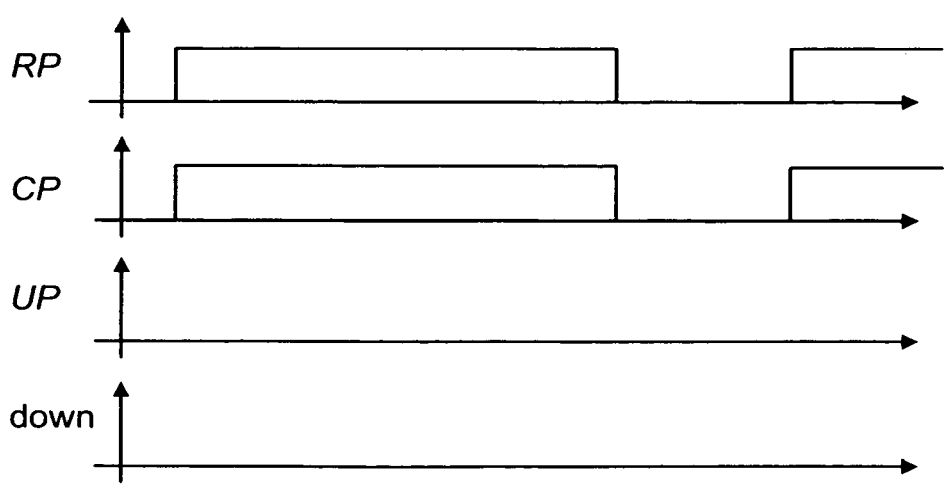

TSCP 90 operates as shown in FIGS. 6A-C. If the pulse of CP pulse train stays on longer than the corresponding pulse of the RP pulse train (see FIG. 6A), indicating that the total delay introduced by delay elements 60 and 62 is too long, then UP current source 100 pumps current $I_0$ into capacitor 92 until flop-flop 48 is reset. This serves to reduce the delay introduced by delay elements 60 and 62. This repeats each cycle until the total delay that is introduced by delay elements 60 and 62 is such that falling edges of the pulses of the CP and RP are aligned (see FIG. 6C). Conversely, if the pulse of RP pulse train stays on longer than the corresponding pulse of the CP pulse train (see FIG. 6B), indicating that the total delay introduced by delay elements 60 and 62 is too short, then DOWN current source 102 drains current $I_0$ out of capacitor 92 until flop-flop 48 is reset. This serves to increase the delay introduced by delay elements 60 and 62. And as before, the repeats each cycle until the total delay that is introduced by delay elements 60 and 62 is such that falling edges of the pulses of the CP and RP are again aligned.

Figure 7:
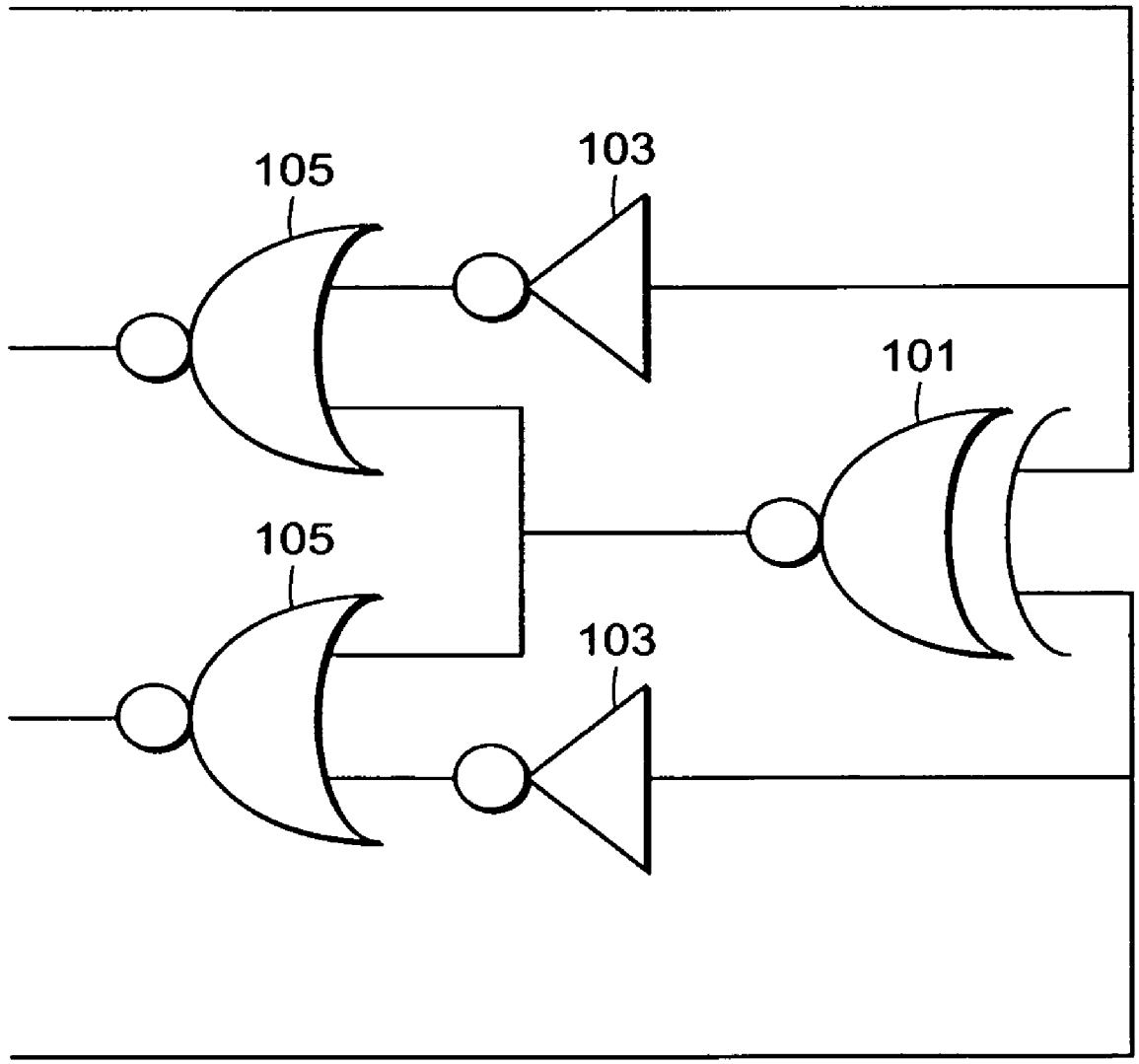
FIG. 7 is a diagram of a circuit that implements the same truth table and the logic circuit used in the tri-state charge pump of FIG. 5.

There are other circuits that implement the same truth table. See for example the circuit of FIG. 7. In this circuit, an EXNOR gate 101 is used in place of XOR gate 94 and a combination of an inverter 103 with a NOR gate 105 is used in place of AND gates 90 and 98. The CP pulse train passes through one of the inverters 103 to drive an input of one of the NOR gates 105 and the RP pulse train passes through the other inverter 103 to drive an input of the other NOR gate 105. The output of EXNOR gate 101 and the other inputs of the two NOR gates 105 are connected at a common node.

The Single line Implementation

It is not essential that two optical waveguides be used. The principles presented above also work if only a single waveguide is used and light pulses are introduced into opposite ends of that single waveguide. In that case, the pulses are indistinguishable with regard to which pulse came from which direction. The ATE circuit that was described above will treat the first detected pulse as a set pulse, the second detected pulse as a reset pulse, the third detected pulse as a set pulse, etc. However, it turns out that it does not matter whether the circuit can distinguish which pulse came from which end since the generated local clock will be either correct or 180° out of phase.

Figure 8:
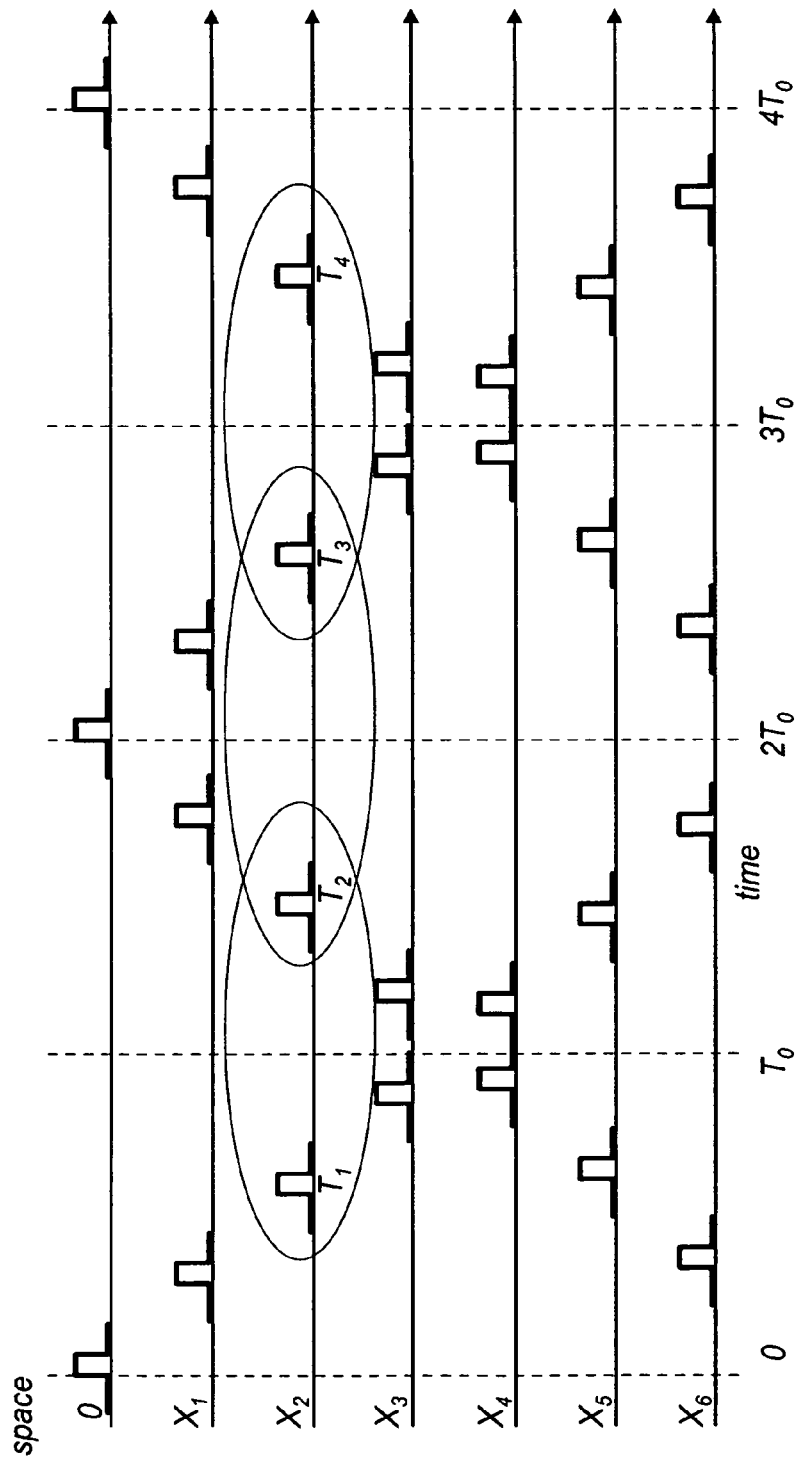
FIG. 8 shows the pulse train pattern in a BOS single line embodiment.

This can be appreciated by examining FIG. 8, which shows the pulses being detected at various locations, $X_n$, along the waveguide. In this example, an identical pulse is introduced into each end of the waveguide and to simplify the explanation it will be assumed that at any given time there are only two pulses on the line, one introduced into the near end of the waveguide (x=0) and the other introduced into the far end of the waveguide (x=L). As indicated, at location x=$X_2$, which is close to the near end of the waveguide, the detector will at time $T_1$ see the first pulse, which is the pulse that was introduced into the near end of the waveguide, and it will see at a much later time $T_2$ the second pulse, which is the pulse that was introduced into the far end. The average time for those two pulses will be aligned with $T_0$. At a later time, the next pulse that the ATE sees will be at $T_3$ (which equals $2T_0+T_1$). This next pulse will be treated as the set pulse in the ATE circuit. Then, at $T_4$ (equal to $2T_0+T_2$), it will see the fourth pulse, which will be the reset pulse. The average time for those two pulses will be aligned with $3T_0$, so the generated local clock will have the same phase as the previously generated local clock.

As illustrated in FIG. 8 by the vertical dashed lines representing the average time between the two detected pulses, this will be true at any location along the waveguide. That is, the ATEs will generate local clocks all having the same skew (i.e., $T_0$).

Moreover, if the ATE selects the "wrong" pulse as the first pulse (i.e., the set pulse), this will only produce a phase error in the generated local clock of 180°. This can be seen as follows. Looking again at location $X_2$ assume that the ATE treats the pulse at $T_2$ as the set pulse. Then, the next detected pulse will be at time $T_3$, which is a pulse that was introduced into the near end of the waveguide. As noted above, $T_3$ equals $2T_0+T_1$. Thus, the average time will be $\frac{1}{2}(T_2+T_3)$, which will be aligned with $2T_0$. That is, $$\tfrac{1}{2}(T_2+T_3)=\tfrac{1}{2}(T_2+T_1+2T_0)=\tfrac{1}{2}(T_2+T_1)+T_0=2T_0$$

Thus, the resulting local clock will be 180° out of phase and this error can be easily corrected by simply shifting its phase 180°.

Figure 9:
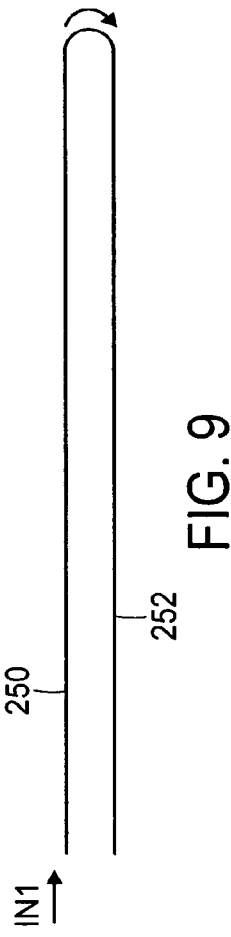
FIG. 9 shows a two parallel waveguides that are joined at the far end.

Another single line implementation is shown in FIG. 9. In this case, two parallel optical waveguides 250 and 252 are connected together at one end. Thus, the IN1 pulse train that is introduced into waveguide 250 and when it reaches the far end of that waveguide it comes back on waveguide 252, thereby becoming IN2. The far end can be connected by a curved portion of waveguide, as suggested by the figure, or by any mechanism that reflects the IN1 signal back into waveguide 252.

Dealing with the Problem of Short Pulses

There will be locations along the pair of waveguides (e.g. waveguide #1 and waveguide #2) at which the two pulses occur very close to each other in time. At some point, the interval of delay between the two pulses will be too short for practical circuits to handle well. As a consequence, operating near those locations may cause difficulty in maintaining a lock with low jitter. One solution is to measure the time delay in the reverse order, where it is closer to $2T_0$ rather than to zero. That is, instead of using the pulse on waveguide #1 as the set pulse (or early pulse) and the pulse on the other waveguide as the reset pulse (or late pulse), reverse the order and use the pulse on waveguide #2 as the early pulse and the other pulse as the late pulse.

Figure 10A:
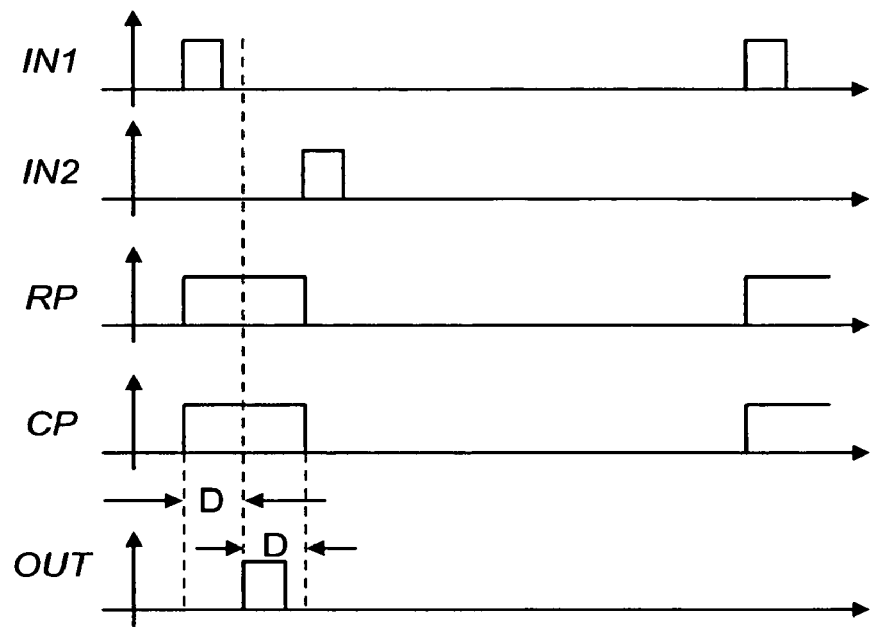
FIGS. 10A-B illustrate the effect of changing the order of the set/reset sequence.
Figure 10B:
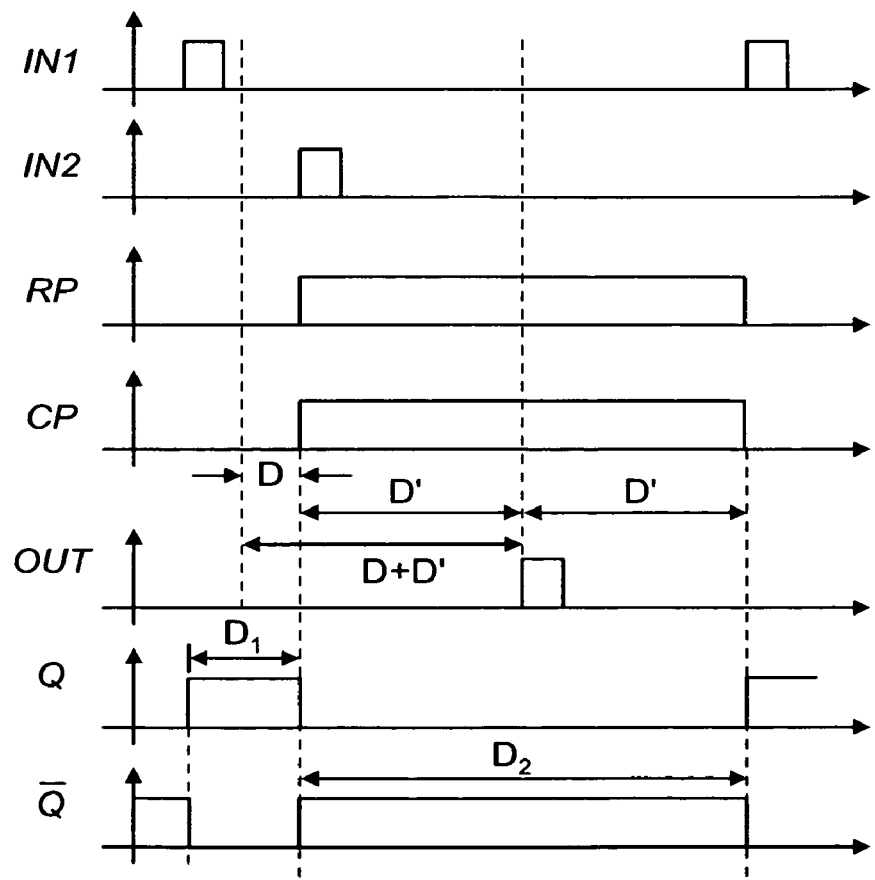

FIGS. 10A-B illustrate the problem and the solution. As shown in FIG. 10A, the clock pulses detected on waveguide #1 are labeled IN1 and the clock pulses detected on waveguide #2 are labeled IN2. At this particular location, the IN2 pulse arrives very soon after the IN1 pulse, namely, 2D. If the pulse on waveguide #1 is treated as the first pulse (or the set pulse), then the reference pulse (RP) and the calibration pulse (CP) that are generated will be relatively short. If the CP pulse becomes too short, it can be difficult to maintain a lock on the average time (i.e., D).

However, by reversing the roles of the pulses, this problem goes away. Thus, by using the pulses detected on waveguide #2 as the set pulses, the delay that is observed before the reset pulse arrives becomes much larger, namely, 2D' (see FIG. 10B). It should be readily apparent that D+D' is equal to $T_0$, or half the period of the clock cycle. Consequently, reversing the order in which the pulses are used to determine the average skew will result in a signal that is 180° out of phase with the signal that would be produced if the pulses were used in the opposite order. This phase difference can be easily corrected by simply changing the phase of the generated clock signal by 180°.

ATE with Automatic Optimum Set/Reset

Figure 11:
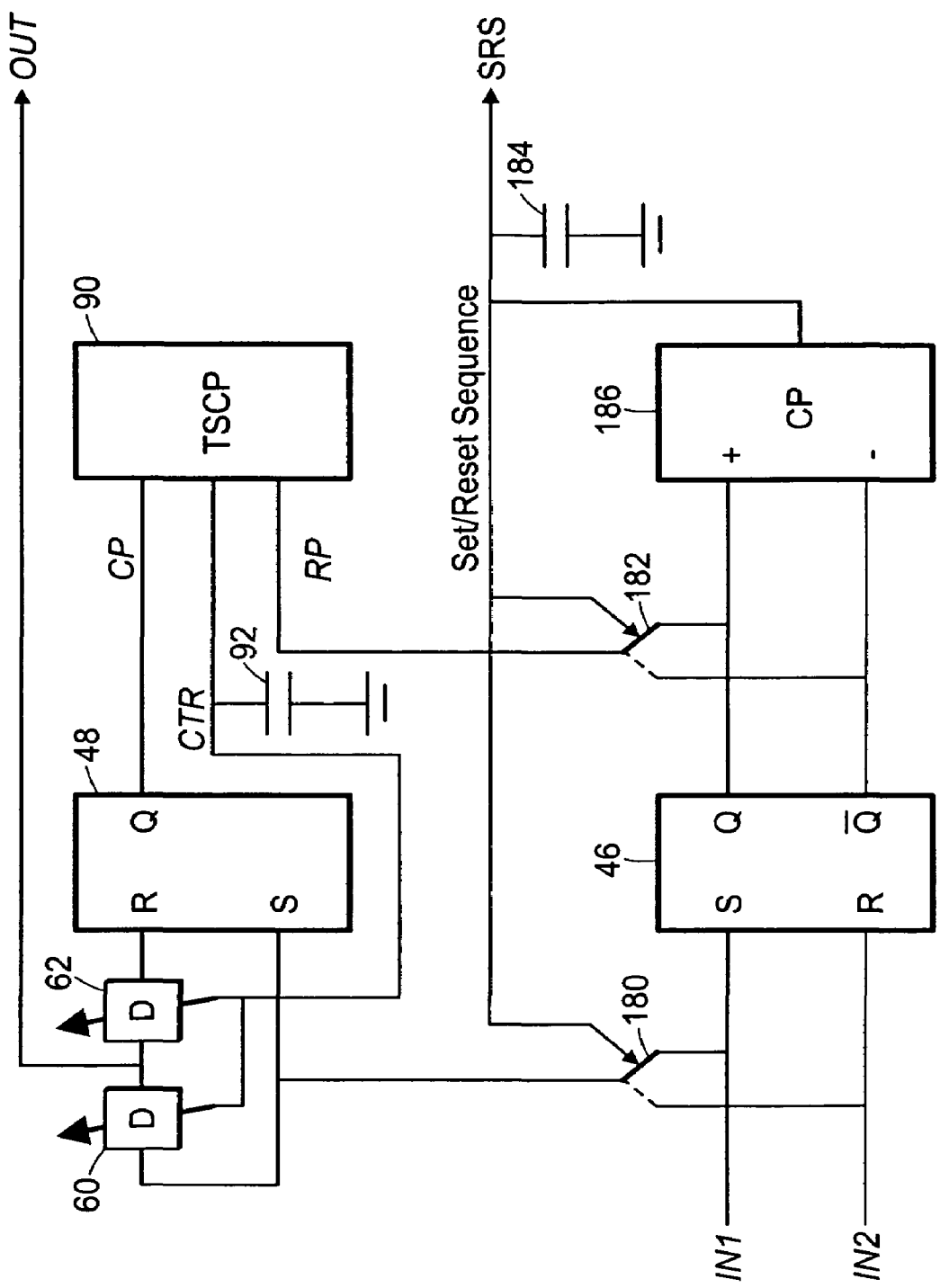
FIG. 11 is a block diagram of an ATE with automatic optimum set/reset.

A circuit which automatically selects the pulse train that is to provide the early pulses is shown in FIG. 11. That is, if the pulses of IN1 and IN2 are as shown in FIG. 10A, the circuit will invert the connections to the optical waveguides to change the set/reset sequence to the one shown in FIG. 10B.

This embodiment is a modification of the circuit shown in FIG. 5 and the components that the two circuits have in common are numbered the same. Those common elements include two set/reset flip-flops 46 and 48, two identical variable delay elements 60 and 62, a tri-state charge pump 90, and a capacitor 92. In addition, there are two switches 180 and 182, the states of which are controlled by the voltage on a capacitor 184. The voltage on the capacitor is, in turn, controlled by a simple charge pump 186. Switch 180 selects which of the two signals, IN1 or IN2, will provide the early pulses and which will provide the late pulses; and switch 182 selects which of the two outputs of flip-flop 46, i.e., Q and Q-bar, will provide the reference (RP) pulses to tri-state charge pump 90. In essence, charge pump 186 in combination with capacitor 184 determines which of two time periods is longest, namely, the time period between a pulse of the IN1 signal followed by the next arriving pulse of the IN2 signal, or the time period between a pulse of the IN2 signal followed by the next arriving pulse of the IN1 signal. The circuit works as follows.

Assuming that the IN1 and IN2 signals are as shown in FIG. 10B, the Q and Q-bar outputs of flip-flop 46 are as indicated. The Q output produces a pulse the duration of which is equal to the time between a pulse of the IN1 signal and the next following pulse of the IN2 signal. Whereas, the Q-bar output produces a pulse the duration of which is equal to the time between a pulse of the IN2 signal and the next following pulse of the IN1 signal. Charge pump 186, in effect, integrates these two signals to produce a net change in the charge of capacitor 184 that is proportional to $Icp \times (D_1-D_2)$, where Icp is the current supplied by the constant current sources within charge pump. This drives the voltage on capacitor 184 to its maximum negative value (e.g. equal to the supply voltage) which, in turn, causes switch 180 to select the IN2 signal to provide the early pulse to flip-flop 48 and causes switch 182 to select the IN1 signal to provide the late or reset pulse (i.e., by selecting the Q output of flip-flop 46 to provide the RP pulse for tri-state charge pump 90).

If $D_1$ had been greater than $D_2$, the opposite would have happened. That is, the voltage across capacitor 184 would have gone positive to its maximum value thereby causing switch 180 to select the IN1 signal to provide the early pulse to flip-flop 48 and causing switch 182 to select the IN2 signal to provide the late (or reset) pulse.

Of course, if the location along the waveguide is such that the two pulses (i.e., the IN1 pulses and the IN2 pulses) arrive at basically the same times, possibly the more practical solution is to simply avoid doing clock generation from those locations.

Average Time Extraction by Closed-Loop Pulse Width Control—Second Variation

Figure 12:
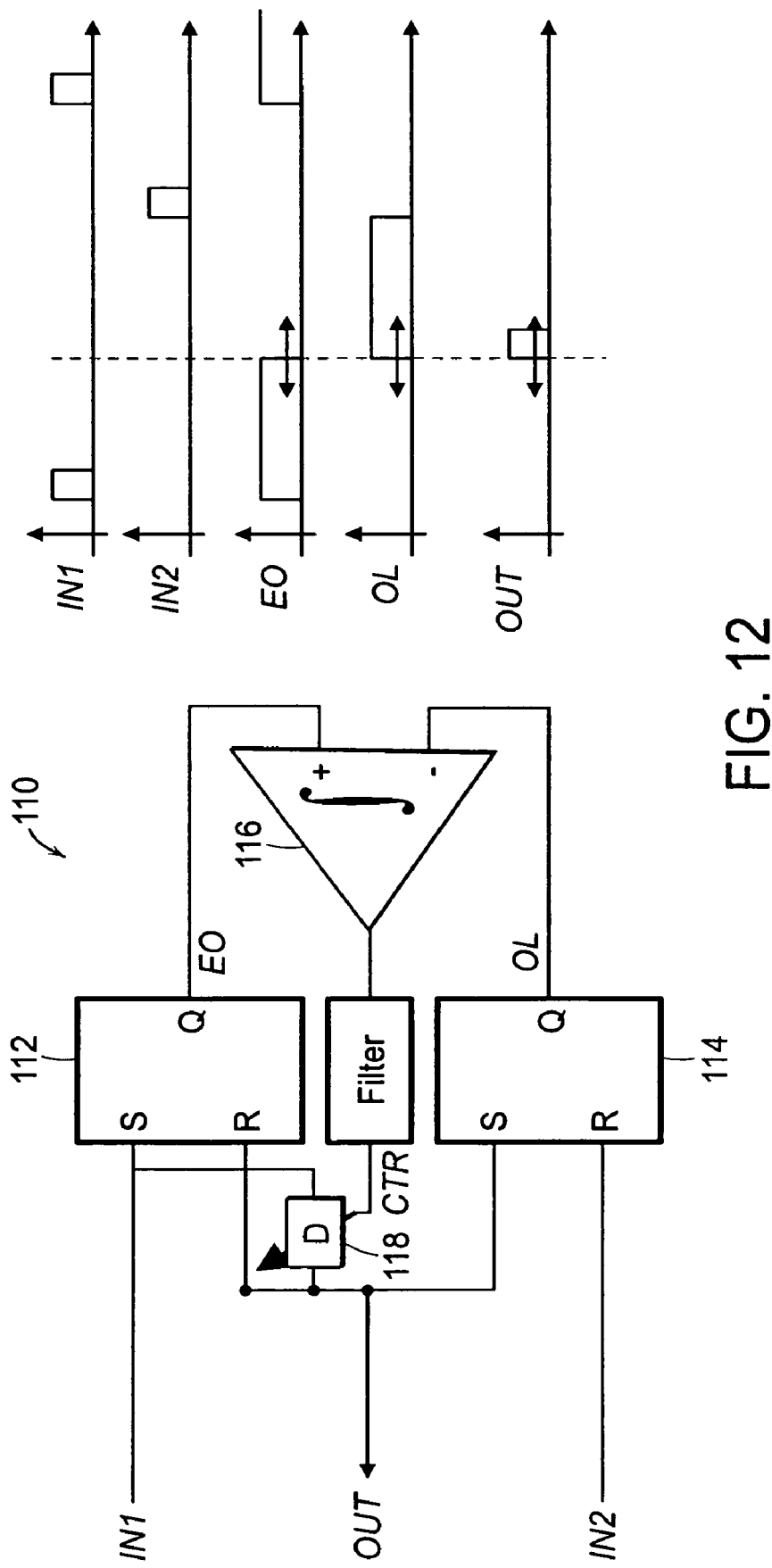
FIG. 12 is a block diagram of another embodiment of an ATE circuit, which uses a single variable delay element.

There are, of course, alternative approaches to implementing the ATE circuit. For example, if we assume that the early pulse train is applied to one input and the late pulse train is applied to the other input, the ATE can include internal means to generate a new pulse train (an "output pulse train") of the same period of the incoming pulses and which can be skewed between the early and late pulse trains under the control of an internal signal. The simplest way to accomplish this functionality is by using a variable delay to skew the early pulse train under the control of a DC voltage or current, as shown in FIG. 12.

The ATE circuit 110 shown in FIG. 10 includes two S-R flip-flops 112 and 114, an integrator 116 with positive and negative inputs, and a single variable delay element 118. Integrator 116 may be similar to previously described integrator 66 and tri-state charge pump 90 (see FIGS. 4A and 5). The early pulse, which is in the IN1 pulse train, sets flip-flop 112 and the late pulse, which is in the IN2 pulse train, resets flip-flop 114. Delay element 118 generates a delayed version of the early pulse and delivers it to both the reset input of flip-flop 112 and the set input of flip-flop 114. The output (EC) of flip-flop 112, referred to as the early-output (EO) pulse train, drives the positive input of integrator 116 and the output of flip-flop 114, referred to as the output-late (OL) pulse train, drives the negative input of integrator 116. By using the three pulse trains defined above (i.e., the incoming early pulse train (IN1), the internally generated output pulse train (OUT) at the output of delay element 118, and the incoming late pulse train (IN2)) ATE 110 generates two additional pulse trains referred to as early-output (EO) pulse train and output-late (OL) pulse train. The feedback control system (including integrator 116) automatically adjusts the skew of the output pulse train until the EO pulses and the OL pulses have identical widths. When this condition is accomplished, the output pulse train skew is the average time skew of the input pulse trains. Stated differently, the pulses of the EO and OL pulse trains are generated such as to give an accurate measure of the skews between the respective pulse trains. In other words, this arrangement adjusts the amount of delay introduced by delay element 118 such that the points at which flip-flop 112 is reset and flip-flop 114 is set to be located in time midway between the early and late pulses. The details are as follows.

The first pulse (IN1) on the set input line of flip-flop 112 produces an up-transition of a new pulse at its output (EO). After a delay of D, the detected pulse of the IN1 signal resets flip-flop 112 and sets flip-flop 114. At that point the output of flip-flop 112 falls to zero to define the end of the pulse that was generated at its output and flip-flop 114 produces an up-transition of a new pulse at its output (OL). Finally, when the late pulse of the IN2 signal arrives, it resets flip-flop 114 to zero to define the end of the pulse that was generated at its output. During the duration of the pulse that occurs at the output of flip-flop 112, when the output of flip-flop 114 is zero, integrator 116 begins to increase the value of the signal appearing at its output at a constant rate, R. As soon as the delayed pulse resets flip-flop 114 and sets flip-flop 114, integrator 116 begins to decrease the signal appearing at its output at the same constant rate, R. The output of integrator 116, without filtering, will be a saw-tooth waveform. But, as should be readily appreciated, if the duration of the pulse of the EO signal is longer than the duration of the pulse of the OL signal, then when the late pulse arrives, the signal at the output of integrator 116 will be at a value that is larger than it was when the early pulse arrived. Similarly, if the duration of the pulse of the EO signal is shorter than the duration of the pulse of the OL signal, then when the late pulse arrives, the signal at the output of integrator 116 will be at a value that is smaller than it was when the early pulse arrived.

A filter 120 at the output of integrator 116 filters this saw-tooth waveform from integrator 116 to generate a DC signal that controls the amount of delay introduced by variable delay element 118. Whenever the duration of the pulses of the EO signal are longer than the duration of the pulses of the OL signal, the DC value at the output of filter will increase, thereby causing the amount of delay that is introduced by variable delay element 118 to decrease. And similarly, whenever the duration of the pulses of the EO signal are shorter than the duration of the pulses of the OL signal, the DC value at the output of filter 120 will decrease, thereby causing the amount of delay that is introduced by variable delay element 118 to increase. Thus, the circuit operates to make the duration of the pulses of the EO and OL signals identical, which in turn positions the pulses of the OUT pulse train a halfway between the pulses of the IN1 pulse train and the IN2 pulse train.

Figure 13:
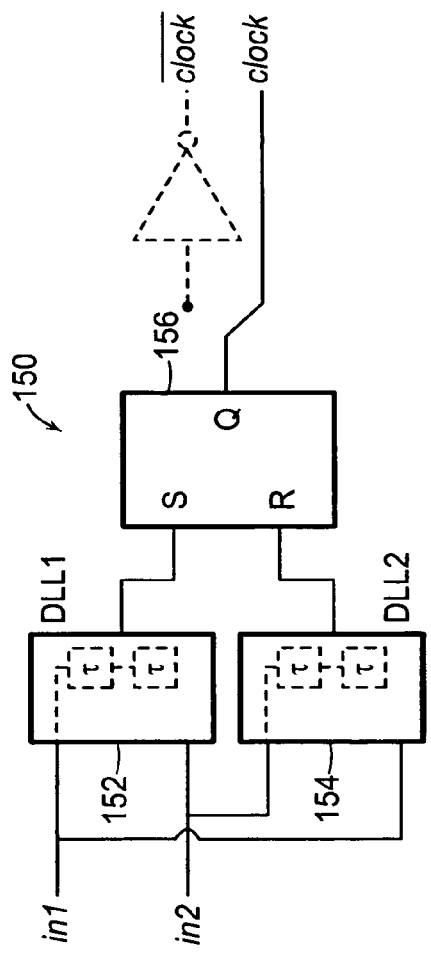
FIG. 13 is a block diagram of a 50% duty cycle clock generation circuit.

50% Duty Cycle Clock Generation:

Note that the skew adjusted output signal of the ATE circuits described above is a train of pulses having the same duration as the pulses received from the optical detector. In other words, they are short pulses. Since short clock pulses can be difficult to use as clock signal, it may be desirable to generate a skew-corrected clock signal that has a 50% duty cycle, i.e., one with longer clock pulses. A generator circuit 150 that produces a 50% duty cycle clock signal is shown in FIG. 13.

Generator circuit 150 includes two ATE's 152 and 154, each with corresponding first and second input lines, and a S-R flip-flop 156. Both ATEs 152 and 154 operate as described above. However, the input signals for ATE 154 are reversed in comparison to the input signals for ATE 152. That is, the pulses of input signal IN1 drive a first input line of ATE 152 and the second input line of ATE 154; while the pulses if input signal IN2 drive the second input line of ATE 152 and the first input line of ATE 154. This means the early pulse for one ATE is treated as the late pulse for the other ATE. As indicated above, the result will be that the ATE 152 will align its skew corrected output pulse train with a first reference time and ATE 154 will align its skew corrected output pulse train with a second reference time that is one half of a period delayed from the first reference time. By using these two reference times to define the pulse of the generated clock sign (e.g. the first reference time defining the up transition and the second reference time defining the down transition), one automatically generates a 50% duty cycle clock signal.

Figure 14:
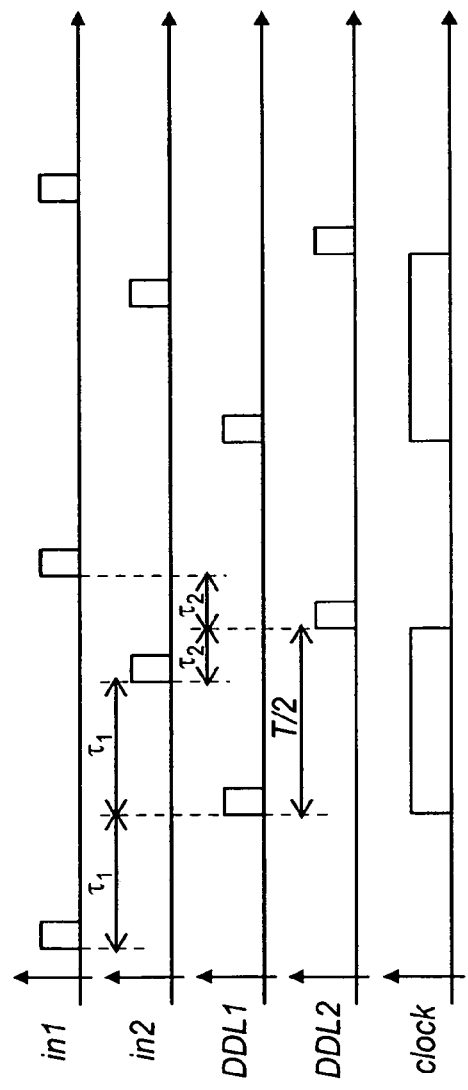
FIG. 14 is a signal timing diagram that illustrates the operation of the 50% duty cycle clock generation circuit of FIG. 13.

The circuit works as follows. Assume the pulse trains on the two waveguides are as shown in FIG. 14. At the selected location long the two waveguides, the pulses of the IN2 pulse train on line 2 are delayed by $2\tau_1$ relative to the pulses of the IN1 pulse train on line 1. Viewed from the other perspective, namely, the timing of the pulses of the IN1 pulse train relative to the timing of pulses of the IN2 pulse train, the pulses on line 1 are delayed by $2\tau_2$ relative to the pulses on line 2. Since the period of the clock signal is T, it is also true case that:

$$2\tau_1 + 2\tau_2 = T.$$

As described above, once the circuits achieve their steady-state operation, the output clock signal from ATE 152 will be delayed by $\tau_1$ relative to the clock pulses of the IN1 pulse train and the output clock signal from ATE 154 will be delayed by $\tau_2$ relative to the clock pulses of the IN2 pulse train. The separation of these two pulses will be exactly T/2, as indicated in FIG. 14.

The output signal of ATE 152 drives the set input of flip-flop 156 and the output signal of ATE 154 drives the reset input of flip-flop 156. The pulses on the set input of flip-flop 156 will cause the output of flip-flop 156 to switch to high, where it will remain until the reset pulse is received, at which time it will drop back down to zero. Thus, the output of flip-flop 156 will be a sequence of pulses that are of duration T/2, that have a period of T, and that are aligned with the average skew of the pulses of the IN1 and IN2 pulse trains. This is shown in the bottom graph of FIG. 14.

Figure 15A:
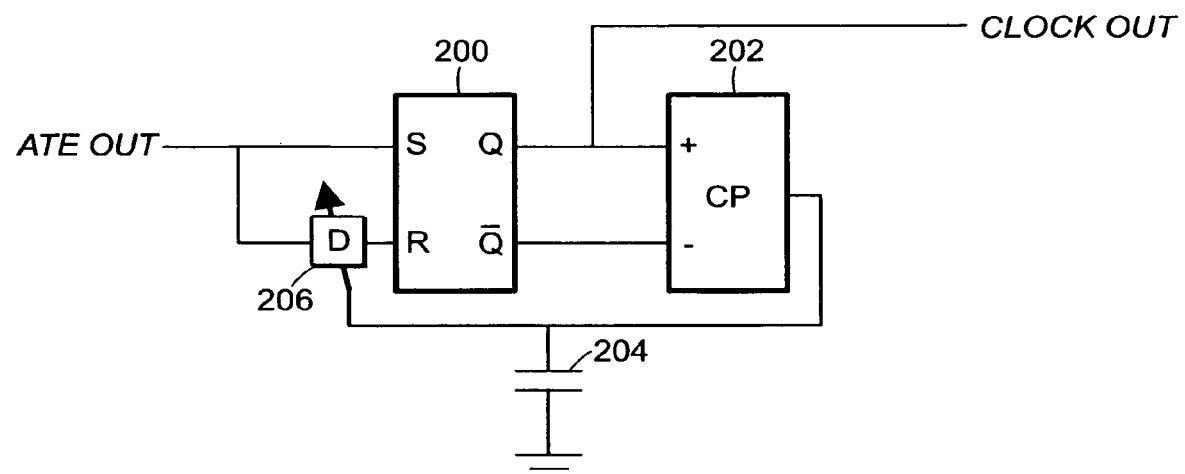
FIG. 15A is a block diagram of another embodiment of the 50% duty cycle clock generation circuit.

Another circuit that generates a 50% duty cycle clock signal from the clock signal coming out of the ATE is shown in FIG. 15A. It includes a set-reset (S-R) flip-flop 200, a charge pump 202, a filter capacitor 204, and a variable delay element 206. The output of the ATE circuit (not shown) drives the set input of flip-flop 200, and after passing through a delay element 206, it then drives the reset input of flip-flop 200. The Q and Q-bar outputs of flip-flip 200 drive corresponding inputs of charge pump 202. In essence, charge pump 202 integrates the difference of the signals that appear on its two inputs. That is, if the signal on the positive input of charge pump 202 is one while the signal on the negative input is zero, charge pump will increase the signal on its output linearly as a function of time. If the signals on the two inputs are the same (i.e., both one or both zero), charge pump 202 will hold its output at a fixed level. And, if the signal on the positive input of charge pump 202 is zero while the signal on the negative input is one, charge pump will decrease the signal on its output linearly as a function of time. Capacitor 204 filters that output signal of charge pump 202 to produce a DC signal that will change slowly with respect to the period of the clock signal.

Figure 15B:
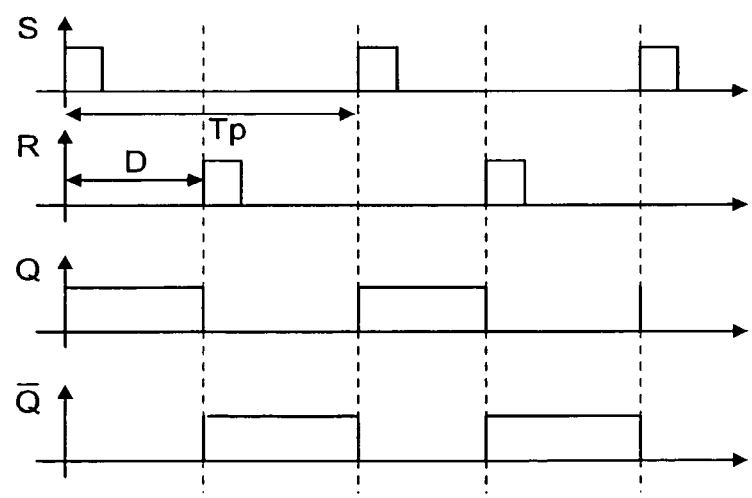
FIG. 15B is signal timing diagram for the circuit of FIG. 15A.

The operation of the circuit is illustrated by the signaling diagrams shown in FIG. 15B. The clock pulse form the ATE circuit sets flip-flop 202 causing its Q output to go high. This output remains high until the reset pulse arrives at a later time determined by variable delay element 206. At that time, the Q output goes to zero and the Q-bar output goes high. The Q-bar output remains high until the next clock pulse from the ATE circuit at which point the sequence just described repeats itself.

If D is less than $\frac{1}{2}T_P$, the duration of the Q output pulse will be shorter than the duration of the Q-bar output pulse and charge pump 202 will cause the voltage on capacitor 204 to decrease for as long as this condition exists. The drop in the voltage on capacitor 204 will, in turn, cause the delay introduced by variable delay element 206 to increase. Finally, when D reaches $\frac{1}{2}T_P$, the output voltage from charge pump 202 will remain constant and the duty cycle of the signal appearing on the Q output will be exactly 50%. Similarly, if D is greater than $\frac{1}{2}T_P$, the duration of the Q output pulse will be longer than the duration of the Q-bar output pulse and charge pump 202 will cause the voltage on capacitor 204 to increase for as long as this condition exits. When D reaches $\frac{1}{2}T_P$, the output voltage from charge pump 202 will remain constant and the duty cycle of the signal appearing on the Q output will again be exactly 50%. In other words, the stable operating point of the circuit exists when $D=\frac{1}{2}/2T_P$, which is the point at which the duty cycle of the signal on the Q output is 50%.

Reference Time Ambiguity

Figure 16:
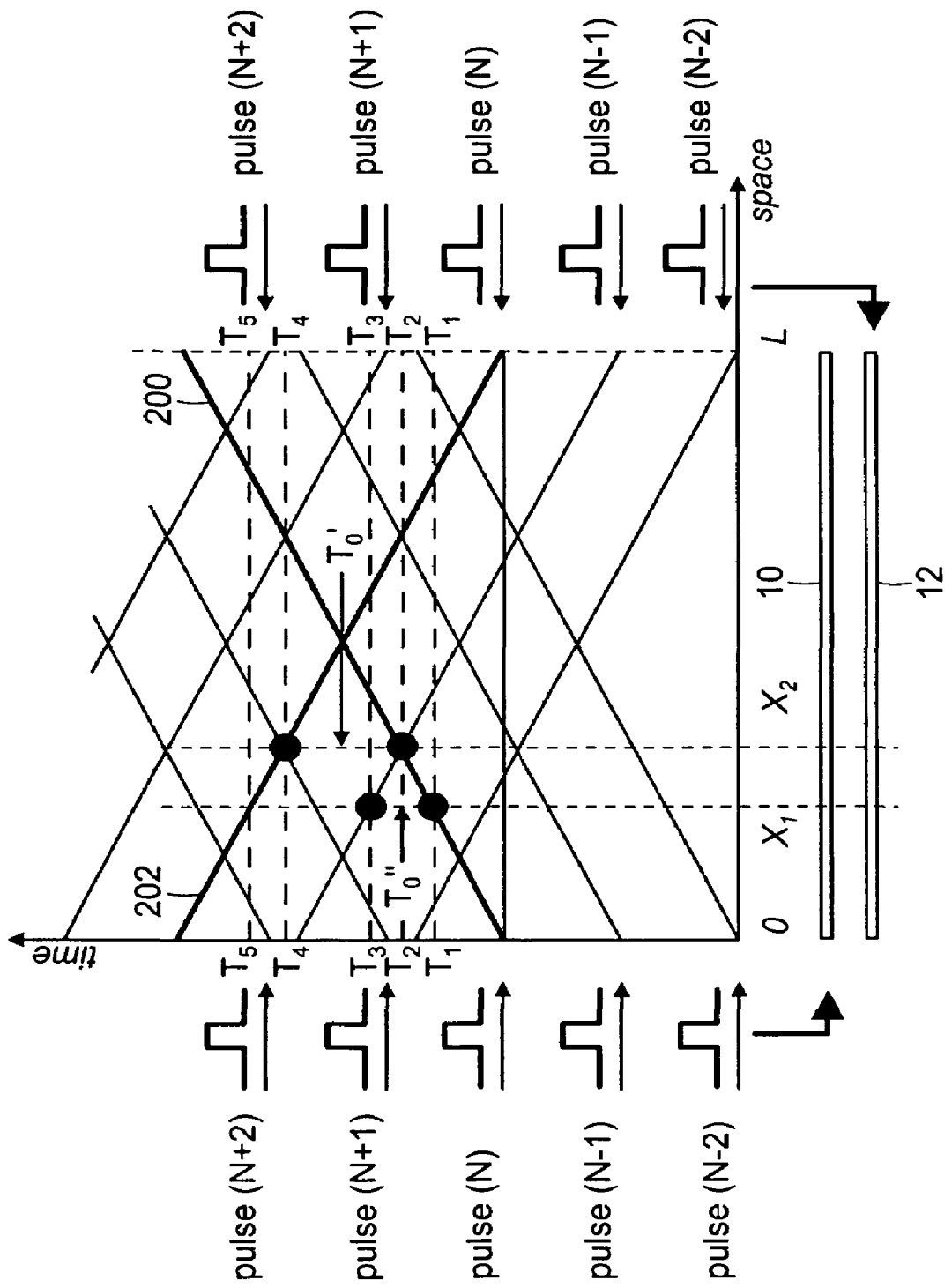
FIG. 16 is a signal timing diagram that illustrates the source of the BOS reference time ambiguity.

In a BOS where the maximum skew is less than one signal period, all ATE generated output signals will be phase-aligned. If the maximum skew exceeds one signal period, a phase difference of 180° (i.e., a sign reversal) between two ATE-generated signals may arise. If the optical waveguides for distributing the clock signal are sufficiently long so the time it takes for a pulse to traverse the entire length of the waveguide is much larger than the period of the clock signal, there will be multiple clock pulses on each line at any given time. This is illustrated in FIG. 16. In this example, the time it takes to traverse the entire length of the optical waveguide is assumed to be $T_L$ and the period of clock signal is $T_C$, which is shorter than $T_L$. For the particular $T_L$ and $T_C$ selected in FIG. 16, there will be at least three clock pulses on each waveguide at any given time. As a consequence, there can be an error in the reference time extraction resulting from selecting the wrong second pulse. The source of the error is also illustrated in FIG. 16 and can be understood as follows.

The clock signal periodically introduces optical pulses into optical waveguide 10. Those pulses, which are illustrated by pulse (N−2) through pulse (N+2) on the left side of FIG. 16, are separated in time by the clock period, $T_C$. Assume that the time at which a pulse (N) is introduced into waveguide 10 is T=0. Then, the movement of pulse N along waveguide 10 is represented by line 200. It reaches location $X_1$ (which is a distance $X_1$ from the beginning of waveguide 10) at time $T_1$ and it reaches location $X_2$ at later time $T_2$.

Now assume a corresponding pulse, also identified in this drawing as a pulse (N), is introduced into the other end of waveguide 12 at the same time as pulse (N) is introduced into waveguide 10. That corresponding pulse travels along waveguide 12, as indicated by line 202 in the graph. Pulse (N) introduced into waveguide 12 reaches location $X_2$ at a time $T_4$ which is later than the time $T_2$ at which the corresponding pulse (N) on waveguide 10 reached that same location. An ATE circuit of the type previously described and located at $X_2$ generates a clock pulse that is aligned with $T_0'$, which is exactly half the distance between $T_4$ and $T_2$, i.e., $T_0'=\frac{1}{2}(T_4-T_2)$. This is the correct reference time.

However, in this example, an ATE located at $X_1$ will not generate its clock pulse at the correct time. After that ATE detects pulse (N) in optical waveguide 10 at time $T_1$, the next pulse it detects in the other optical waveguide 12 will be pulse (N−1), not the corresponding pulse (N), and that will be at time $T_3$. This is because multiple pulses are present on each waveguide at any given time and because the time it takes for a pulse introduced into waveguide 12 to reach location $X_1$ is greater than $T_C$, the period of the clock signal. The ATE at location $X_1$ is not able to determine which pulse detected on waveguide 12 is the one that corresponds to pulse (N) that was detected on waveguide 10. It simply treats the next received pulse on waveguide 12 as the correct one and establishes the reference time accordingly. In this case, the reference time will be $T_0''$, which is $\frac{1}{2}(T_3-T_1)$. As can be clearly seen in the graph, $T_0''$ is different from $T_0'$.

If the ATE at location $X_1$ were able to ignore pulse (N−1) on waveguide 12 and instead detect next pulse on waveguide 12 as the late pulse, which would be pulse (N) arriving at time $T_5$, then the reference pulse would occur at $\frac{1}{2}(T_5-T_1)$ which equals $T_0'$.

In fact, the timing of the reference pulse that is generated by the ATE is related to the correct reference pulse as follows:

$$T_0''=\tfrac{1}{2}(T_5-T_C-T_1)=\tfrac{1}{2}(T_5-T_1)-\tfrac{1}{2}T_C=T_0'-\tfrac{1}{2}T_C$$

In other words, the reference pulse that is generated by the ATE is delayed by one half the period of the clock cycle.

By going through the analysis presented above, it should be easy to convince oneself that regardless of the location along the waveguides that the ATE's are located, the generated clock pulses will either be properly synchronized with the desired reference pulses for the system or will be out of phase with those pulses by 180°.

AC Phase Alignment Principle

The phase ambiguity can be resolved with the approach illustrated in FIG. 17. In this system, the chip is partitioned into multiple local clocking regions 300A-G and a master optical clock signal is distributed to the local regions over two waveguides 302 and 304. For illustration purposes only, FIG. 17 shows that there are seven local clocking regions but in practice there is likely to be many more. As previously described, the master optical clock signal is introduced into one end of waveguide 302 and it is introduced into the opposite end of waveguide 304. In each local clocking region, there is an ATE circuit 310 that generates a local electrical clock signal for that region based upon the two optical clock signals detected on the two waveguides. The local clocking regions are limited in size so that the maximum clock skew that will occur for the electrical clock signal generated for that region will be no greater than a predefined small amount, e.g. 10%.

The ATE in one of the local clocking regions functions as a master ATE 320 and the remainder of the ATEs function as slave ATEs. Master ATE 320 establishes the electrical clock signal with which the local clock signals in all of the other regions will be aligned. In the described embodiment, master ATE 320 is located within a centrally located region relative to the distributed optical clock distribution signal, with approximately half of the other ATEs on one side and the remaining half on the other side. Though locating the master ATE near the midpoint of the clock distribution circuit is desirable, it could be located anywhere along the distribution paths of the optical clock signals.

Besides generating the local electrical clock signal, each ATE 310 including master ATE 320 also generates a synchronizing signal (i.e., synch signal) on an output line (or synch signal line) 312 that communicates that signal to the next nearest downstream neighbor. The synch line is used to inform the nearest neighbor of the correct phase alignment for that nearest neighbor's local clock signal. In the described embodiment, the synch signal is simply the local clock signal that the ATE is generating for its local region. This could be taken directly from the ATE in a dedicated line for that purpose or from the local clock signal distribution circuit for distributing the locally generated clock signal. Master ATE 320, unlike the other ATE's, sends its synch signal to its two nearest neighbors, one on each side. Based on that synch signal, the neighboring ATE brings its clock signal into phase alignment with the clock signal of the master ATE. Each slave ATE 310, in turn, sends its synch signal (i.e., its locally generated clock signal) to its next nearest downstream neighbor. Based on the received synch signal, the neighboring ATE brings its local clock signal into phase alignment with its upstream neighbor. As the correct phase information propagates outward from master ATE 320, all of the ATEs come into phase alignment with the clock signal that is being generated by the master ATE.

Recall that the ATEs will generate local clock signals that are either in phase alignment with the local clock signal of the master ATE or in phase opposition (i.e., 180° out of phase) with the local clock signal of the master ATE. This is a characteristic of the way the ATEs operate, as described above, and as illustrated in FIG. 16. Thus, it becomes a simple matter to bring all ATEs into correct phase alignment. An ATE need only compare its local clock signal to the local clock signal being generated by its upstream neighbor to determine whether its phase is correct or needs to be flipped to bring it into alignment. Each ATE includes circuitry (not shown) which examines the locally generated clock signal at the time that the pulse of the synch signal is received. If the locally generated clock signal is high, that indicates it is in alignment with the locally generated clock signal of upstream neighbor. On the other hand, if the locally generated clock signal is low, that indicates it is 180° out of phase with the locally generated clock signal of the upstream neighbor. In that case, the ATE shifts the phase of its locally generated clock signal by 180° to bring it into phase with its neighbor.

The phase shift can be accomplished in a number of ways including, for example, by simply reversing the order in which the pulse signal streams are sampled so that IN2 provides the early pulse and IN1 provides the late pulse. If a 50% duty cycle clock signal is generated by using one of the circuits shown in FIGS. 13 and 15A, then the Q-bar output of the flip-flop can be selected instead of the Q output to generate the 180° phase shift. Or, alternatively, an inverter can be switched into the local clock signal line (as shown in dashed outline in FIG. 13) to accomplish the same thing.

The correct alignment information will propagate outwards from the master ATE; and the local clock signals being generated by the slave ATEs will all fall into alignment with the clock signal being generated by the master ATE. That is, each slave ATE starting with the two closest to the master ATE will use the received synch signal to align its local clock signal with that of the master and then will send the new synch signal to the next slave ATE down the chain until the clock signals of all slave ATEs are aligned with that of the master ATE.

DC Phase Alignment Principle

An alternative approach to bringing all of the clocks into proper phase alignment is illustrated in FIG. 18. In this system, the chip is partitioned into multiple local clocking regions 330A-E and a master optical clock signal is distributed to the local regions over two waveguides 332 and 334. Again, for illustration purposes only, FIG. 18 shows that there are five local clocking regions but in practice there is likely to be many more. As previously described, the master optical clock signal is introduced into one end of waveguide 332 and it is also introduced into the opposite end of waveguide 334. In each local clocking region, there is an ATE circuit 336 (or 338) that generates a local electrical clock signal for that region based upon the two optical clock signals detected on the two waveguides. The local clocking regions are limited in size so that the maximum clock skew that will occur for the electrical clock signal generated for that region will be no greater than a predefined small amount, e.g. 10%.

An ATE in one of the local clocking regions functions as a master ATE 338 and the remainder of the ATEs function as slave ATEs 336. Master ATE 338 establishes the electrical clock signal with which the local clock signals in all of the other regions will be aligned. As before, though the master ATE is shown as located within a centrally located region relative to the distributed optical clock distribution signal, it could be located anywhere along the distribution paths of the optical clock signals.

The clock signal distribution circuit also includes a phase detector (PD) 340 for each of the slave ATEs 336. Each phase detector 340 provides a synchronization signal to a corresponding different one of the slave ATEs and is located near the boundary separating that slave ATE from its upstream neighbor. Each phase detector 340 compares the local electrical clock signal obtained from the local clocking region containing the associated ATE with the local electrical clock signal from the upstream neighbor. The points from which each phase detector 340 obtains the two clocking signals are near to each other and also near the outer boundaries of the two relevant clocking regions. Since the local clocking regions have dimensions that are small in comparison to the clock period (or more precisely in comparison to the distance that the clock signal travels in one clock period), the detected phase difference will either be very small (i.e., near 0°) or very large (i.e., near 180°), indicating that the clock signals generated by the two ATEs are either in phase or out of phase, respectively. The phase detector generates a DC signal on its output line 348 identifying the phase relationship of the detected two clock signals, e.g. a high signal indicates the two are out of phase and a low signal indicates that the two are in phase.

The ATE to which the phase detector provides its control signal over its output line 348 responds to the DC signal for the phase detector in one of two ways. If the DC signal is low (or a zero), it does nothing since the local clock signal in the two regions are phase aligned. If the DC signal is high (e.g. a one), the ATE shifts the phase of the clock signal that it is generating by 180° to thereby bring its clock signal into alignment with the clock signal being generated in the neighboring upstream local clocking region. If the ATE changes the phase of the clock signal that it is generating, its associated phase detector will sense that the two clock signals are now in alignment and will change its output signal from high to low.

This mechanism will bring each of the locally generated clock signals one at a time into phase alignment with the clock signal being generated by the master ATE.

An Alternative Method for Eliminating Phase Ambiguity

The circuit shown in FIG. 13 also provides a way of eliminating the phase ambiguity. Note that if the outputs of ATEs 152 and 154 are added (e.g. using an OR operation) then the resulting pulse train is the combination of both pulse trains DLL1 and DLL2 shown in FIG. 14. That is, it is a pulse train having a frequency that is twice the frequency of in1 or in2. As one can readily see, this eliminates any ambiguity that might result as described above. This is the equivalent of multiplying two sinusoidal clock signals, as described elsewhere herein. This technique works with pulses that are short compared to the half the transmitted clock period. Thus, the resulting clock at twice the frequency does not have 50% duty cycle.

It is also possible, using a combination of the above-described techniques, to adjust the pulse to have ¼ of the original clock period and then add them as shown in FIG. 13 to generate a final clock (at twice the frequency) but with a 50% duty cycle. This is done by applying the DLL1 and DLL2 signals that are generated by ATE 152 and 154, respectively, as inputs to two other ATEs and then passing the results to flip-flop 156.

Alternatively, after generating the non-50% duty cycle clock signal having twice the frequency, one can divide this clock signal back to the original frequency which will also produce the 50% duty cycle. Indeed, getting a 50% duty cycle signal by ½ division turns out to be a very reliable and accurate way of doing it.

ATE with PLL-Generated Output

Figure 19:
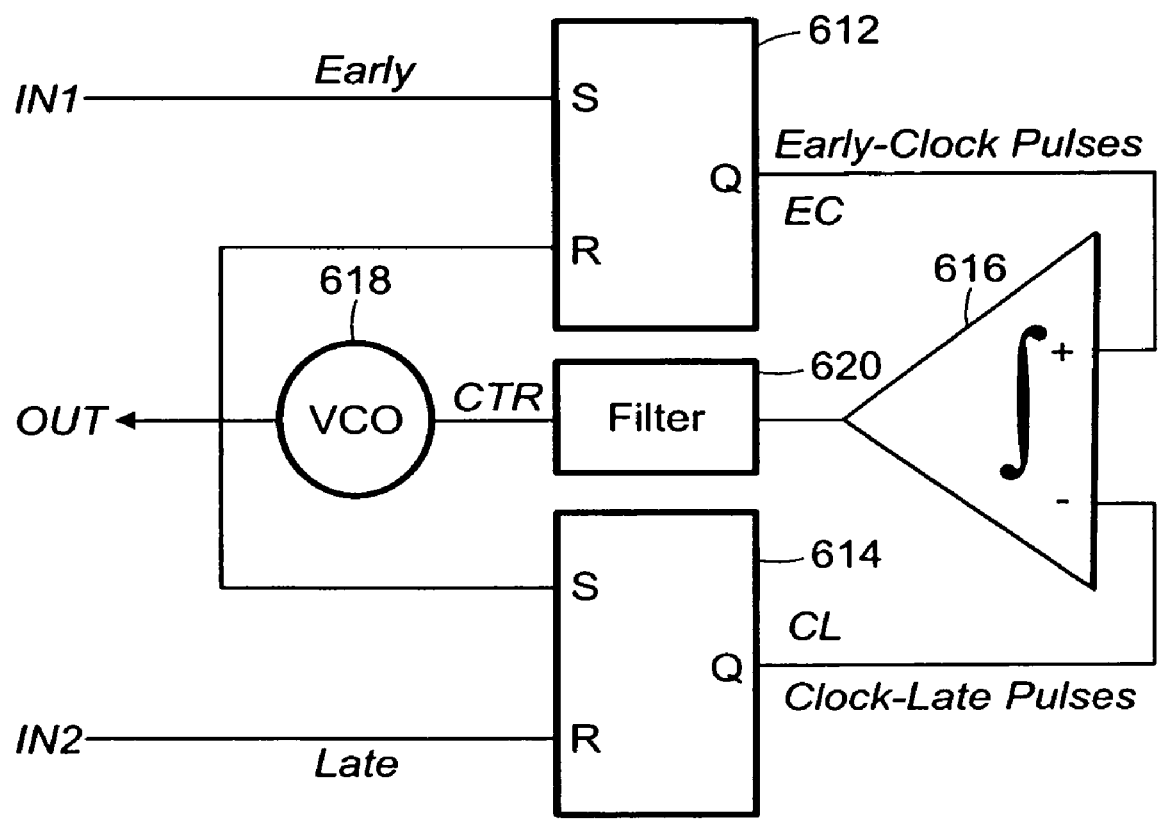
FIG. 19 is a block diagram of an ATE circuit with a Phase-Locked Loop (PLL) generated output.

Another design for an ATE circuit is illustrated in FIG. 19. Like the previous described ATE circuits, it includes two flip-flops 612 and 614 and an integrator 616. But instead of using delay elements to generate the local clock signal, it uses a voltage controlled oscillator (VCO) 618, the frequency of which is controlled output of integrator 616. The early pulse, which is established by the IN1 pulse train, sets flip-flop 612, and the late pulse, which is established by the IN2 pulse train, resets flip-flop 614. VCO 618 generates a local clock signal which is fed back to the reset input of flip-flop 612 and the set input of flip-flop 614. The output of flip-flop 612, referred to as the early-clock pulse train (EC), drives the positive input of integrator 616 and the output of flip-flop 614, referred to as the clock-late pulse train (CL), drives the negative input of integrator 614. The rising edges of the local clock signal generated by VCO 618 determine the relative widths of the pulses in the two pulses trains EC and CL. The feedback system (including integrator 616 and a filter 620), which controls VCO 618, automatically adjusts the frequency of VCO 618 so that the EC pulses and the CL pulses have identical widths. When this condition is achieved, the skew of the output pulse train (i.e., the generated local clock signal) is the average of the skews of the input pulse trains IN1 and IN2. The details of operation are as follows.

Figure 20:
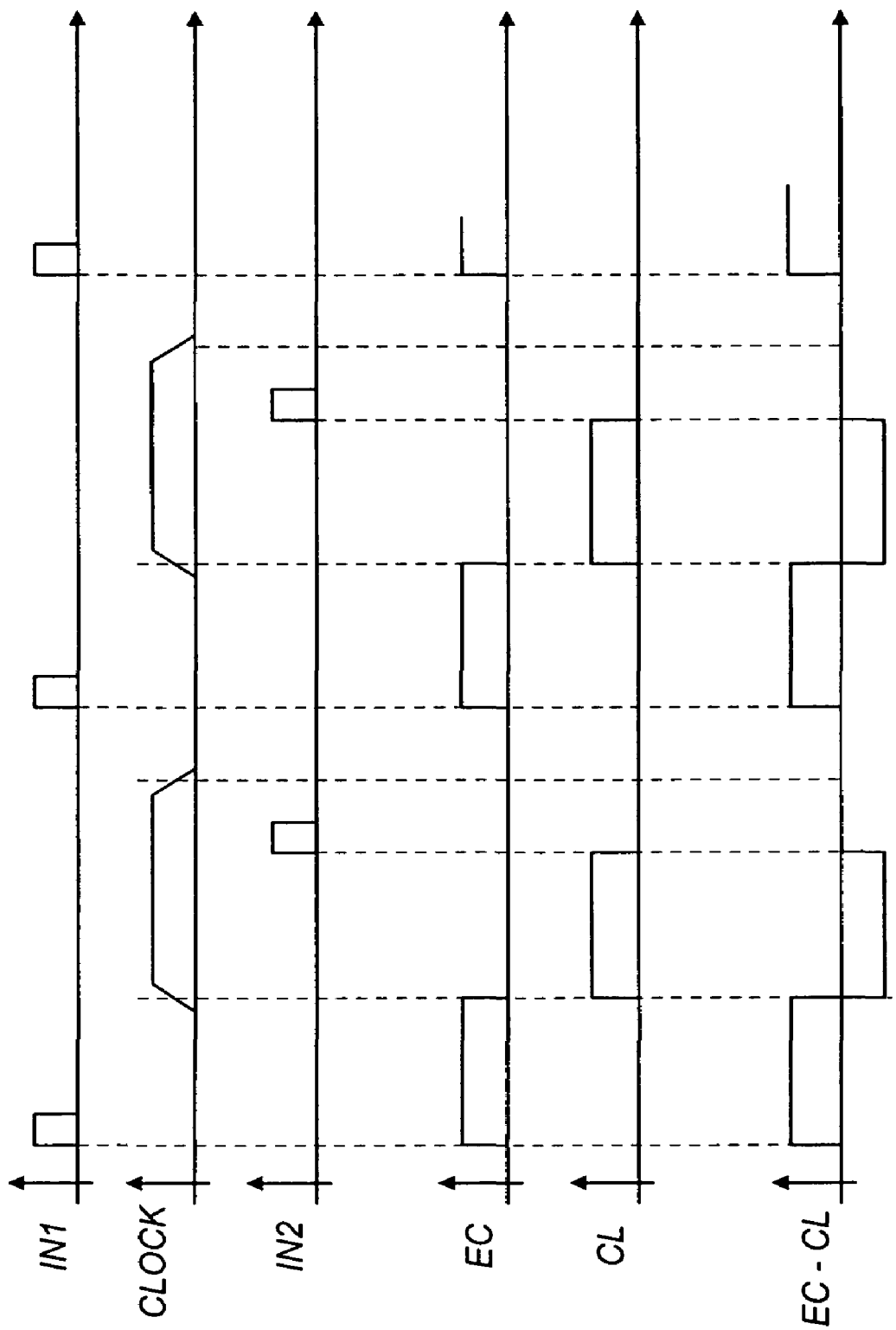
FIG. 20 shows the signal timing diagrams showing one stable operating state for the circuit of FIG. 19.

Referring to FIGS. 19 and 20, the first pulse (IN1) on the set input line of flip-flop 112 produces an up-transition of a new pulse at its output (EC). After a certain period of time, the rising edge of the local clock signal generated by VCO 618 occurs. That resets flip-flop 612, thereby defining the end of the pulse that was generated at its output, and it sets flip-flop 614, thereby defining the beginning of the pulse that is generated at its output. The output of flip-flop 614 remains high until the next pulse of the IN2 pulse train occurs. At that point, the output of flip-flop 612 falls to zero defining the end of the pulse that was generated at its output and flip-flop 614 produces an up-transition of a new pulse on its output. When the late pulse of the IN2 signal arrives, it resets flip-flop 614 to zero to define the end of the pulse that was generated at its output. During the duration of the pulse that occurs at the output of flip-flop 612, when the output of flip-flop 614 is zero, integrator 616 begins increasing the voltage at its output at a constant rate by, in essence, sourcing a constant current into a storage capacitor for the duration of the pulse on the positive input of integrator 616. As soon as the rising edge of the local clock signal resets flip-flop 614 and sets flip-flop 614, integrator 616 begins decreasing the voltage at its output by, in essence, sinking the same fixed current output the capacitor. Without any filtering, the output of integrator 616 will be a sawtooth waveform. However, filter 620, which has a time constant that is substantially longer than the period of the clock signal, averages this sawtooth waveform to produce a voltage that is the average of the output of integrator 618. When the duration of the pulse in the EC pulse train is longer than the period of the pulse in the CL pulse train, the average value that is output by filter 620 increases thereby causing the frequency of the VCO to increase. This, in effect, decreases the duration of the pulses of the EC pulse train and increases the duration of the pulses in the CL pulse train. Similarly, when the duration of the pulse in the EC pulse train is shorter than the period of the pulse in the CL pulse train, the average value that is output by filter 620 decreases thereby causing the frequency of the VCO to decrease. This, in effect, increases the duration of the pulses of the EC pulse train and decreases the duration of the pulses in the CL pulse train. When the duration of the pulses of the two pulse trains EC and CL are equal, the output of filter 620 remains constant. In other words, the circuit functions to move the period of the generated local clock signal to equal the period of global clock signal and it aligns its phase with the midpoint between one pulse of IN1 and the next occurring pulse of IN2.

With regard to the circuit of FIG. 19, it is to be noted that in addition to the stable operating point that was just described, there is a second stable operating point. The second stable operating point is illustrated by the signal timing diagrams shown in FIG. 21. It is characterized by a generated local clock signal that is 180° out of phase with the local clock signal that is generated in the example illustrated by FIG. 20.

Figure 21:
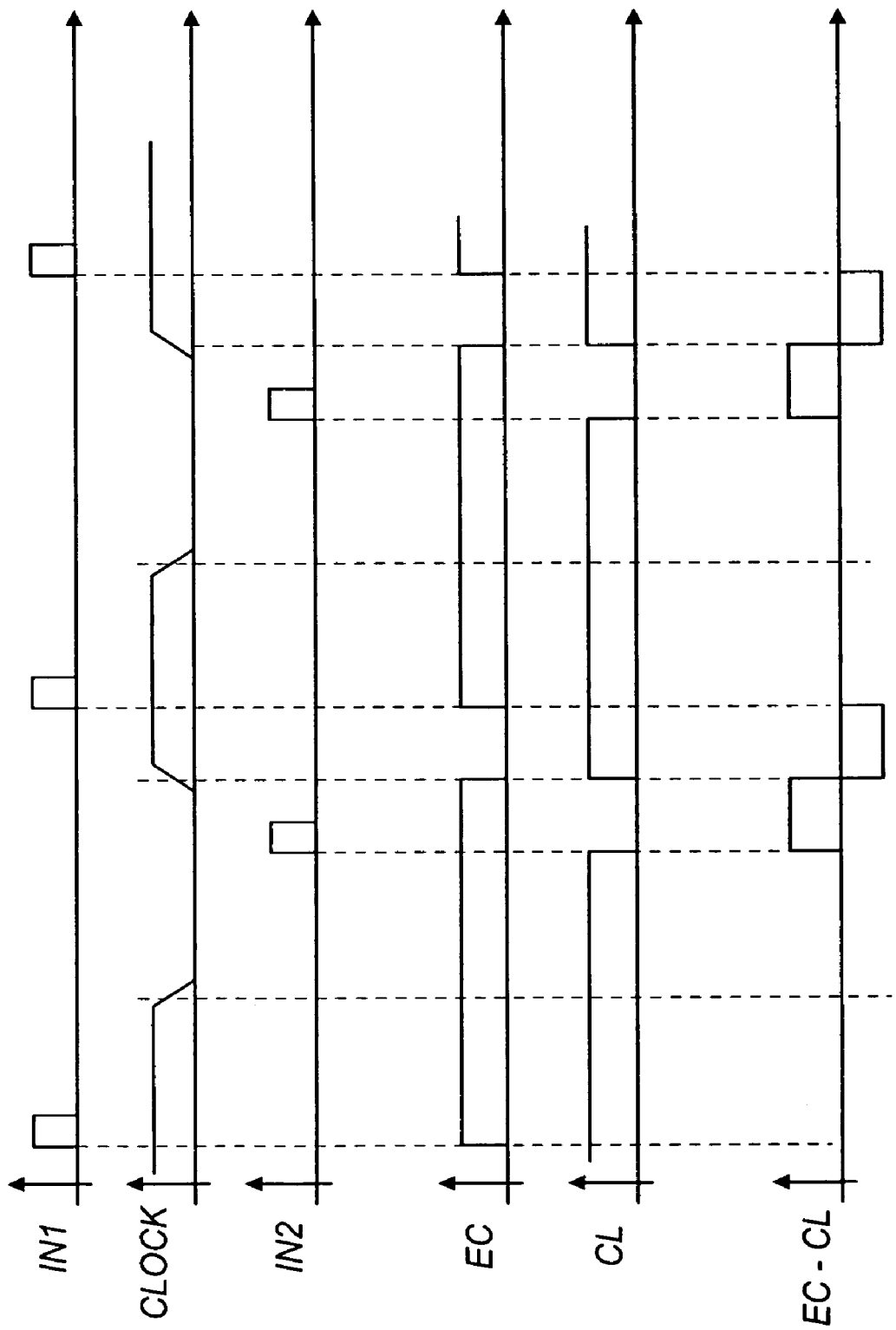
FIG. 21 shows the signal timing diagrams showing another stable operating state for the circuit of FIG. 19.

To see how this other operating point comes about assume again that the pulse on IN1 starts a new pulse of the EC pulse train as indicated in FIG. 21. This time, however, also assume that the next rising edge of the local clock signal does not occur until after the next pulse of the IN2 pulse sequence arrives. In that case, when the next rising edge of the clock signal occurs, it ends the pulse of the EC pulse train and begins a new pulse of the CL pulse train. This new pulse of the CL pulse sequence, however, will not end until the next reset pulse of the IN2 pulse train occurs, which is much later. In the meantime, a next pulse of he IN1 sequence will arrive to start a new pulse of the EC pulse train. For the rest of the time until the next pulse of the IN2 sequence arrives, the outputs of both flip-flops 612 and 614 will remain high. When the IN2 pulse arrives the pulse of the CL pulse train will end and soon thereafter, the rising edge of the local clock signal will arrive ending the pulse of the EC pulse train and starting a new pulse of the CL pulse train.

Integrator 616 looks at the difference of the signals at its two inputs. If the positive input is high while the negative input is low, the output of the integrator will rise; if the positive input is low while the negative input is high, the output of the integrator will fall; and if the positive input and the negative input are both high (or both low), the output of the integrator will remain constant.

The difference signal, i.e., EC-CL, appears as shown in FIG. 21. The circuit will adjust the period and phase of the local clock signal so that the rising edge of the locally generated clock signal will occur at the midpoint between a pulse of the IN2 sequence and the next occurring pulse of the IN1 sequence. It should be clear from the diagram for EC-CL when that occurs, the output of the integrator will remain constant and the circuit will be at a stable operating point.

Figure 22:
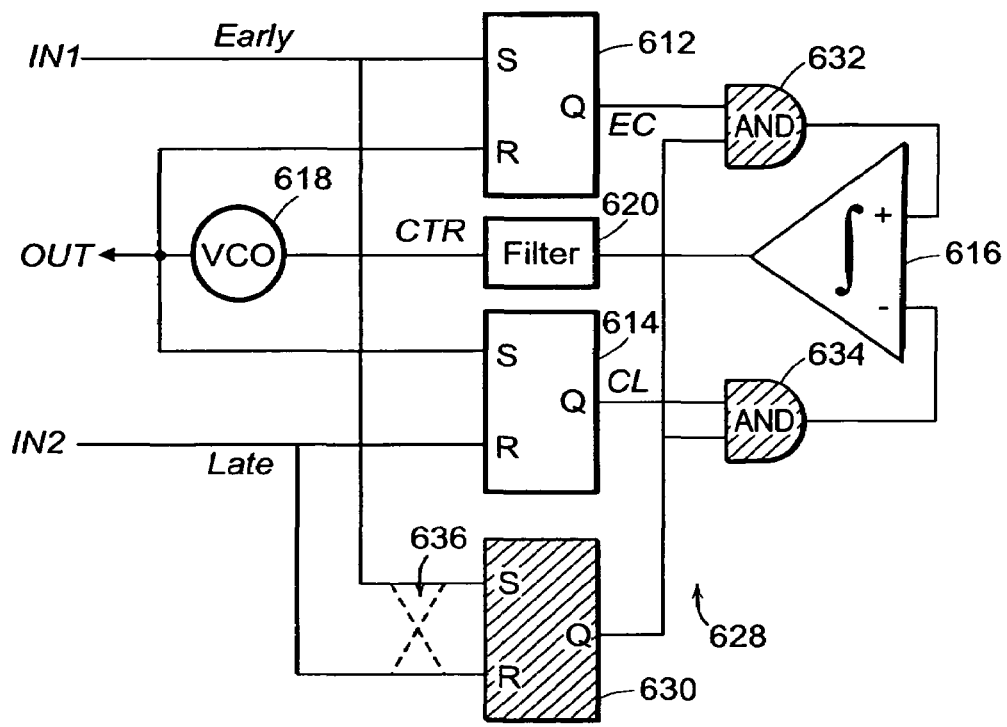
FIG. 22 is a block diagram of an ATE circuit with a Phase-Locked Loop (PLL) generated output and with gating circuitry that forces one stable operating point.

To eliminate one of the stable states, the circuit shown in FIG. 22 is employed. In addition to the previously described circuitry, it also incorporates gating circuitry 628 which includes a set-reset flip-flop 630 and two AND gates 632 and 634. The IN1 pulse sequence drives set input of flip-flop 630 and the IN2 pulse sequence drives the reset input. The output of flip-flop 630 drives an input of each of AND gates 632 and 634. The EC pulse signal sequence drives the second input of AND gate 632 and the CL pulse signal sequence drives the second input of AND gate 634. The outputs of AND gates 632 and 634 drive corresponding inputs of integrator 616. In essence, gating circuitry 628 prevents the EC and EL signals from reaching integrator 616, except during a period that lies between an IN1 pulse and the next occurring IN2 pulse. For all other times, namely the period between an IN2 pulse and the next occurring IN1 pulse, neither pulse sequence to reach integrator 616. When the pulse of the IN1 sequence arrives, it sets flip-flop 630 thereby causing its output to go high. This, in turn, enables AND gates 632 and 634 to pass whatever signal appears on their other input. When the IN2 pulse arrives, it resets flip-flop 630 thereby causing its output to go low which, in turn, disables AND gates 632 and 634 and blocks the signals appearing on their other inputs to pass through to integrator 616. For the arrangement shown in FIG. 22, the only stable operating point is the one shown in FIG. 20.

The circuit can also include a switch 636 which reverses the inputs to flip-flop 630. When inputs are reversed, the pulses of the IN2 sequence serve to set flip-flop 630 and the pulses of the IN1 sequence serve to rest flip-flop 630. In that case, the stable operating point is the one shown in FIG. 21.

ATE by Multiplication:

Note that the skew correction principles described herein are not restricted to only using pulse sequences as the clock signals. The principles also apply to periodic signals in general. If the periodic signal is sinusoidal, a particularly simple implementation exists for generating local clock signals that are all phase aligned.

Assume any sequential linear transmission system and excite it at one end with a sinusoidal excitation. The linearity condition ensures that in steady state, all signals at all nodes in the system are sinusoidal, albeit with different magnitudes and phases (skews). Next consider a reference point (any point) in the system and define the phase at this point as the reference phase $\phi_0$. The signal at this reference point is $\alpha_0 \sin(\omega_0 t + \phi_0)$, where $\alpha_0$ is the magnitude and $\omega_0$ is the frequency. Now consider two extra points in the system, one placed before the reference point and the other placed after the reference point. Furthermore, choose these two extra points such that their respective phases are at equal "electrical distance" (or equal "optical distance," if using optical signals) from the reference phase. That is, the first point has a signal:

$$\alpha_1 \sin(\omega_0 t + \phi_0 - \Delta\phi)$$

and the second point has a signal:

$$\alpha_2 \sin(\omega_0 t + \phi_0 + \Delta\phi).$$

Note that this is possible in any continuous transmission system even if it is non homogeneous. Also, note that no restrictions are placed on $\Delta\phi$, which may be much larger than $2\pi$.

Next, use a standard trigonometric identity to obtain:

$$\alpha_1 \sin(\omega_0 t + \phi_0 - \Delta\phi) \times \alpha_2 \sin(\omega_0 t + \phi_0 + \Delta\phi) = \alpha_1 \alpha_2 [\cos(2\Delta\phi) - \cos(2\omega_0 t + 2\phi_0)] \quad (1)$$

In other words, the simple multiplication of the signals at the two points at equal electrical distance (length) from the reference point yields a DC term $\alpha_1 \alpha_2 \cos(2\Delta\phi)$ and a phase invariant term $\alpha_1 \alpha_2 \cos(2\omega_0 t + 2\phi_0)$ at twice the transmitted signal frequency. The DC term can be easily eliminated in practice through AC coupling and the remaining $\alpha_1 \alpha_2 \cos(2\omega_0 t + 2\phi_0)$ term provides a clock signal with a precise phase relationship to the reference phase.

Figure 23:
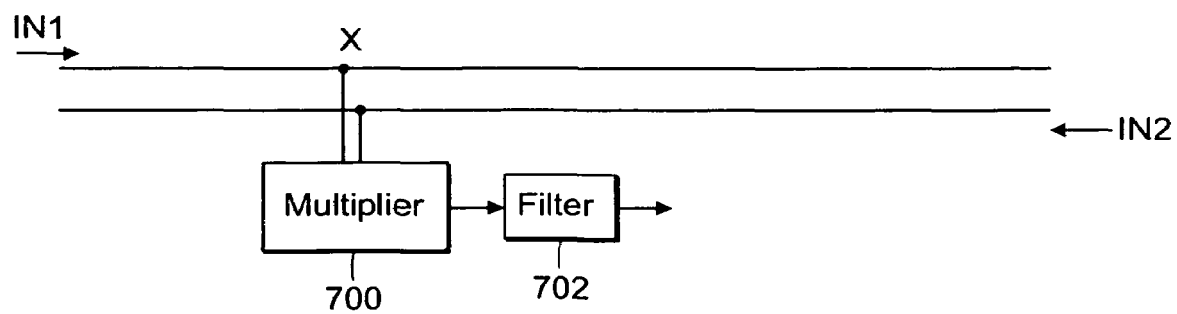
FIG. 23 is a block diagram of an ATE circuit that multiples the two clock signal to generate a phase-aligned local clock signal.

A circuit that implements this principle is shown in FIG. 23. It includes a multiplier circuit 700 that takes as its two inputs the detected first clock signal on line 1 (i.e., IN1) at point X and the detected second clock signal on line 2 (i.e., IN2) also at point X. Relative to the midpoint of the waveguide, the detected first clock signal is shifted in phase by an amount $-\Delta\phi$ and the detected second lock signal is shifted in phase by an amount $+\Delta\phi$. In other words, the two detected signal correspond to the signals discussed above, namely, $\alpha_1 \sin(\omega_0 t + \phi_0 - \Delta\phi)$ and $\alpha_2 \sin(\omega_0 t + \phi_0 + \Delta\phi)$. Thus, multiplier produces as its output the product of these two signals, which as noted above includes a DC term and a term having twice the frequency of the clock signals. The circuit also includes a high pass filter 702 (e.g. capacitor) that removes the DC term leaving the local clock signal with a phase of $2\phi_0$.

The phase of this local clock signal will be the same regardless of where point X is located along the waveguides. Thus, all points for which respective equally electrically-distant points exist with respect to the reference, can be synchronized by simple multiplication and DC removal operations. Also note that using multiplication results in a local clock signal for which there will be no phase ambiguity. And this implementation which uses sinusoidal signals has the further advantages that it is very simple to implement and it requires no feedback.

The clock signal distribution circuit may involve a combination of the BOS and a BES techniques. The BOS technique could be used to generate the local clock signals for the local regions, which might themselves be physically large areas in which the distributed electrical local clock signals exhibited significant skews. To address the skews within the large local regions, the BES techniques could be used. Thus, the resulting circuit would be a hybrid in which both techniques were used: BOS for large scale clock distribution and BES for local distribution.

It should be understood that the parallel optical waveguides could be of any configuration that would be appropriate for distributing the clock signal to all of the required local clocking regions. In other words, they could be two straight-line waveguides, spirally arranged waveguides, or they could be laid out in a serpentine configuration.

Other embodiments are within the following claims.

What is claimed is:

1. A method comprising:
   introducing a first global clock signal into a first end of a signal distribution system so that the first global clock signal propagates from the first end to the second end of the signal distribution system;
   introducing a second global clock signal into the second end of the signal distribution system so that the second global clock signal propagates from the second end to the first end of the signal distribution system;
   in each of a plurality local clocking regions located along the signal distribution system, detecting the first and second global clock signals and generating therefrom a local clock signal for that local clocking region, wherein the generated local clock signals for at least some of the plurality of local clocking regions are in a first group all of which are aligned in phase with each other and the generated local clock signals for the remainder of the plurality of local clocking regions are in a second group all of which are aligned in phase with each other, and wherein the phase of the first group is out of phase with the phase of the second group by a predetermined amount; and
   bringing all of the local clock signals for the plurality of local clocking regions into phase alignment so that the phase of the first group is in phase with the phase of the second group.

2. The method of claim 1, wherein one of the local clocking regions is a master clocking region and the rest of the plurality of clocking regions are slave clocking regions, and wherein bringing all of the local clock signals for the plurality of regions into phase alignment comprises bringing all of the lock clock signals for all of the slave clocking regions among the plurality of clocking region into phase alignment with the local clock signal of the master clocking region.

3. The method of claim 2 wherein bringing all of the local clock signals for the plurality of regions into phase alignment comprises, in each slave clocking region among the plurality of clocking regions, obtaining clocking information from another local clocking region among the plurality of clocking regions and depending on that clocking information obtained from said another local clocking region either changing the phase of the local clock signal for that local clocking region by said predetermined amount or leaving the phase of the local clock signal for that local clocking region unchanged.

4. The method of claim 2, wherein the phase of the first group is out of phase with the phase of the second group by 180°.

5. The method of claim 4, wherein bringing all of the local clock signals for the plurality of local clocking regions into phase alignment so that the phase of the first group is in phase with the phase of the second group involves inverting the local clock signals of the second group.

6. The method of claim 2, wherein bringing all of the local clock signals for the plurality of regions into phase alignment comprises, in each slave clocking region among the plurality of clocking regions, receiving the local clock signal from a neighboring local clocking region that is among the plurality of clocking regions and in at least some of the local clocking regions using that received local clock signal to align the local clock signal for that local clocking region with the local clock signal of the neighboring local clocking region.

7. The method of claim 6, wherein the phase of the first group is out of phase with the phase of the second group by 180°.

8. The method of claim 7, wherein using that received local clock signal to align the local clock signal for that local clocking region with the local clock signal of the neighboring local clocking region involves one of either shifting its phase by 180° or leaving its phase unchanged.

9. The method of claim 1, wherein the first and second global clock signals are optical signals, and wherein the signal distribution system is an optical waveguide.

10. The method if claim 9, wherein the local clock signal in each of the plurality of local clocking regions is an electrical signal.

11. The method of claim 1, wherein the signal distribution system comprises a first optical waveguide and a second optical waveguide, wherein introducing the first global clock signal into the first end of the signal distribution system involves introducing the first global clock signal into one end of the first optical waveguide, and wherein introducing the second global clock signal into the second end of the signal distribution system involves introducing the second global clock signal into one end of the second optical waveguide.

12. The method if claim 11, wherein the local clock signal in each of the plurality of local clocking regions is an electrical signal.

13. The method of claim 1, wherein the plurality of local clocking regions is greater than two.

14. A method comprising:
distributing two global clock signals over a clock signal distribution system;
in each of a plurality local clocking regions located along the signal distribution system, detecting the two global clock signals and generating therefrom a local clock signal for that local clocking region, wherein the generated local clock signals for at least some of the plurality of local clocking regions are in a first group all of which are aligned in phase with each other and the generated local clock signals for the remainder of the plurality of local clocking regions are in a second group all of which are aligned in phase with each other, and wherein the phase of the first group is out of phase with the phase of the second group by a predetermined amount; and
bringing all of the local clock signals for the plurality of local clocking regions into phase alignment so that the phase of the first group is in phase with the phase of the second group.

15. The method of claim 14, wherein the plurality of local clocking regions is greater than two.

16. An integrated circuit comprising:
a clock signal distribution network having a first end and a second end, said clock signal distribution network for carrying a first global clock signal that travels from the first end to the second end and a second global clock signal that travels from the second end to the first end; and
a plurality of local clocking regions arranged along the clock signal distribution network, each of which includes a local clock signal generation circuit and an associated detector arrangement that connects that clock signal generation circuit to the clock signal distribution network at a predetermined location within that local clocking region, wherein the local clock generation circuit in each local clocking region generates during operation a local clock signal based upon the first and second clock global signals that are detected by the detector arrangement at the predetermined location within that local clocking region,
wherein the plurality of local clocking regions includes a master local clocking region,
wherein, among the plurality of local clocking regions, each local clocking region other than the master local clocking region also includes a synchronization signal line connecting the local clock signal generated by the local clock generation circuit in a neighboring local clocking region to the local clock signal generation circuit in that local clocking region, and
wherein the local clock signal generation circuit in each local clocking region other than the master local clocking region also includes phase alignment circuitry that during operation responds to a signal delivered over the synchronization signal line by aligning the local clock signal for that local clocking region with the local clock signal of the neighboring local clocking region when that delivered signal indicates a nonalignment condition exists.

17. The integrated circuit of claim 16, wherein the clock signal distribution network is a single signal transmission line.

18. The integrated circuit of claim 16, wherein the clock signal distribution network comprises first and second signal transmission lines, both of which extend from the first end of the clock signal distribution network to the second end of the signal distribution network, wherein the first signal transmission line is for carrying the first global clock signal and the second signal transmission line is for carrying the second global clock signal.

19. The integrated circuit of claim 18, wherein in each of the local clocking regions, the detector arrangement therein comprises a first detector connected to the first signal transmission line and a second detector connected to the second signal transmission line.

20. The integrated circuit of claim 18, wherein the first signal transmission line is a first optical waveguide and the second signal transmission line is a second optical waveguide.

21. The integrated circuit of claim 16, wherein the local clock signal in each local clocking region is an electrical signal.

22. The integrated circuit of claim 16, wherein the phase alignment circuitry in each local clocking region comprises an inverter.

* * * * *